US012598995B2

(12) United States Patent
Tseng et al.

(10) Patent No.: US 12,598,995 B2
(45) Date of Patent: Apr. 7, 2026

(54) SEMICONDUCTOR DEVICE AND METHOD OF FORMING SAME

(71) Applicant: Taiwan Semiconductor Manufacturing Co., Ltd., Hsinchu (TW)

(72) Inventors: Chih-Hsiang Tseng, Hsinchu (TW); Yu-Feng Chen, Hsinchu (TW); Cheng Jen Lin, Kaohsiung (TW); Wen-Hsiung Lu, Tainan (TW); Ming-Da Cheng, Jhubei (TW); Kuo-Ching Hsu, Chung-Ho (TW); Hong-Seng Shue, Zhubei (TW); Ming-Hong Cha, Hsinchu (TW); Chao-Yi Wang, Tainan (TW); Mirng-Ji Lii, Sinpu Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 575 days.

(21) Appl. No.: 17/385,205

(22) Filed: Jul. 26, 2021

(65) Prior Publication Data

US 2021/0351139 A1 Nov. 11, 2021

Related U.S. Application Data

(63) Continuation of application No. 16/598,796, filed on Oct. 10, 2019, now Pat. No. 11,075,173.
(Continued)

(51) Int. Cl.
*H01L 23/58* (2006.01)
*H01L 21/02* (2006.01)
(Continued)

(52) U.S. Cl.
CPC ...... *H01L 23/585* (2013.01); *H01L 21/02013* (2013.01); *H01L 21/486* (2013.01);
(Continued)

(58) Field of Classification Search
CPC ......... H01L 21/78; H01L 21/50; H01L 21/56; H01L 21/02013; H01L 21/486;
(Continued)

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |

(Continued)

FOREIGN PATENT DOCUMENTS

| | | |
|---|---|---|
| CN | 106298694 A | 1/2017 |
| CN | 106486442 A | 3/2017 |

(Continued)

*Primary Examiner* — Teresa M. Arroyo
(74) *Attorney, Agent, or Firm* — Slater Matsil, LLP

(57) ABSTRACT

A semiconductor package includes a first die having a first substrate, an interconnect structure overlying the first substrate and having multiple metal layers with vias connecting the multiple metal layers, a seal ring structure overlying the first substrate and along a periphery of the first substrate, the seal ring structure having multiple metal layers with vias connecting the multiple metal layers, the seal ring structure having a topmost metal layer, the topmost metal layer being the metal layer of the seal ring structure that is furthest from the first substrate, the topmost metal layer of the seal ring structure having an inner metal structure and an outer metal structure, and a polymer layer over the seal ring structure,
(Continued)

the polymer layer having an outermost edge that is over and aligned with a top surface of the outer metal structure of the seal ring structure.

20 Claims, 26 Drawing Sheets

Related U.S. Application Data

(60) Provisional application No. 62/753,340, filed on Oct. 31, 2018.

(51) Int. Cl.

| | |
|---|---|
| *H01L 21/48* | (2006.01) |
| *H01L 23/31* | (2006.01) |
| *H01L 23/522* | (2006.01) |
| *H01L 23/532* | (2006.01) |

(52) U.S. Cl.
CPC ...... *H01L 23/3171* (2013.01); *H01L 23/5226* (2013.01); *H01L 23/53228* (2013.01); *H01L 2224/02331* (2013.01); *H01L 2224/0239* (2013.01)

(58) Field of Classification Search
CPC ....... H01L 21/565; H01L 23/29; H01L 24/11; H01L 24/13; H01L 24/16; H01L 24/03; H01L 24/05; H01L 23/3114; H01L 23/562; H01L 23/528; H01L 23/3121; H01L 23/49838; H01L 23/31; H01L 23/481; H01L 23/3171; H01L 23/5226; H01L 23/53228; H01L 23/585; H01L 2224/1146; H01L 2224/13022; H01L 2224/13082; H01L 2224/81191; H01L 2224/814; H01L 2224/94; H01L 2224/81815; H01L 2224/02331; H01L 2224/0239; H01L 2224/03462; H01L 2224/03464; H01L 2224/0401; H01L 2224/05572; H01L 2224/1132; H01L 2224/16237; H01L 2224/73204; H01L 2224/11; H01L 2224/03; H01L 2924/00014; H01L 2924/014

See application file for complete search history.

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,601,439 B1 | 3/2017 | Tang et al. | |
| 9,673,154 B2 | 6/2017 | Tsutsue et al. | |
| 9,780,046 B2 | 10/2017 | Pan et al. | |
| 9,818,729 B1 | 11/2017 | Chiu et al. | |
| 10,249,574 B2 | 4/2019 | Ling | |
| 10,283,400 B1 | 5/2019 | Kelly et al. | |
| 10,510,719 B2 | 12/2019 | Yu et al. | |
| 2004/0188843 A1* | 9/2004 | Wakayama | H01L 23/585 |
| | | | 257/E23.002 |
| 2006/0220173 A1* | 10/2006 | Gan | H01L 23/49822 |
| | | | 257/E21.511 |
| 2014/0084445 A1* | 3/2014 | Lin | H01L 23/367 |
| | | | 438/122 |
| 2015/0091161 A1* | 4/2015 | Tomita | H01L 23/585 |
| | | | 257/737 |
| 2015/0348916 A1* | 12/2015 | Chen | H01L 21/4825 |
| | | | 257/669 |
| 2016/0020181 A1 | 1/2016 | Yu et al. | |
| 2017/0141052 A1 | 5/2017 | Pan et al. | |
| 2017/0263569 A1 | 9/2017 | Sommer et al. | |
| 2018/0122751 A1* | 5/2018 | Chen | H01L 23/5389 |
| 2018/0261467 A1* | 9/2018 | Matsumoto | H01L 21/768 |
| 2018/0315723 A1* | 11/2018 | Singh | H01L 23/562 |
| 2019/0363079 A1* | 11/2019 | Thei | H01L 24/89 |
| 2020/0105682 A1* | 4/2020 | Liu | H01L 24/81 |
| 2020/0135664 A1* | 4/2020 | Tseng | H01L 21/486 |

FOREIGN PATENT DOCUMENTS

| | | |
|---|---|---|
| CN | 106711140 A | 5/2017 |
| CN | 107527826 A | 12/2017 |
| TW | I593065 B | 7/2017 |
| TW | I594340 B | 8/2017 |

* cited by examiner

1

SEMICONDUCTOR DEVICE AND METHOD OF FORMING SAME

PRIORITY CLAIM AND CROSS-REFERENCE

This application is a continuation of U.S. patent application Ser. No. 16/598,796, filed on Oct. 10, 2019, entitled "Semiconductor Device and Method of Forming Same," which claims the benefit of U.S. Provisional Application No. 62/753,340, filed on Oct. 31, 2018, which applications is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of materials over a semiconductor sub-strate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area or smaller heights than conventional pack-ages, in some applications.

Thus, new packaging technologies have begun to be developed. These relatively new types of packaging tech-nologies for semiconductor devices face manufacturing challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

2

Figure 22:
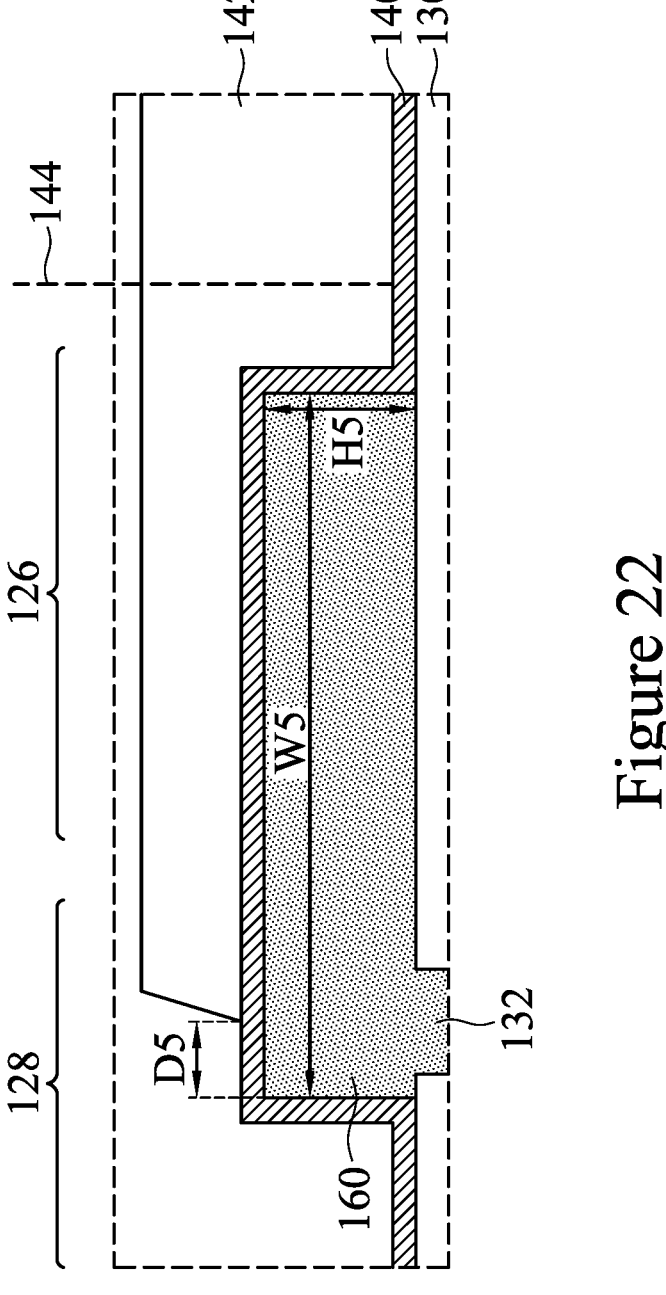

FIG. 22 illustrates a cross-sectional view of an interme-diate stage of manufacturing of a device in accordance with some embodiments.

Figure 23:
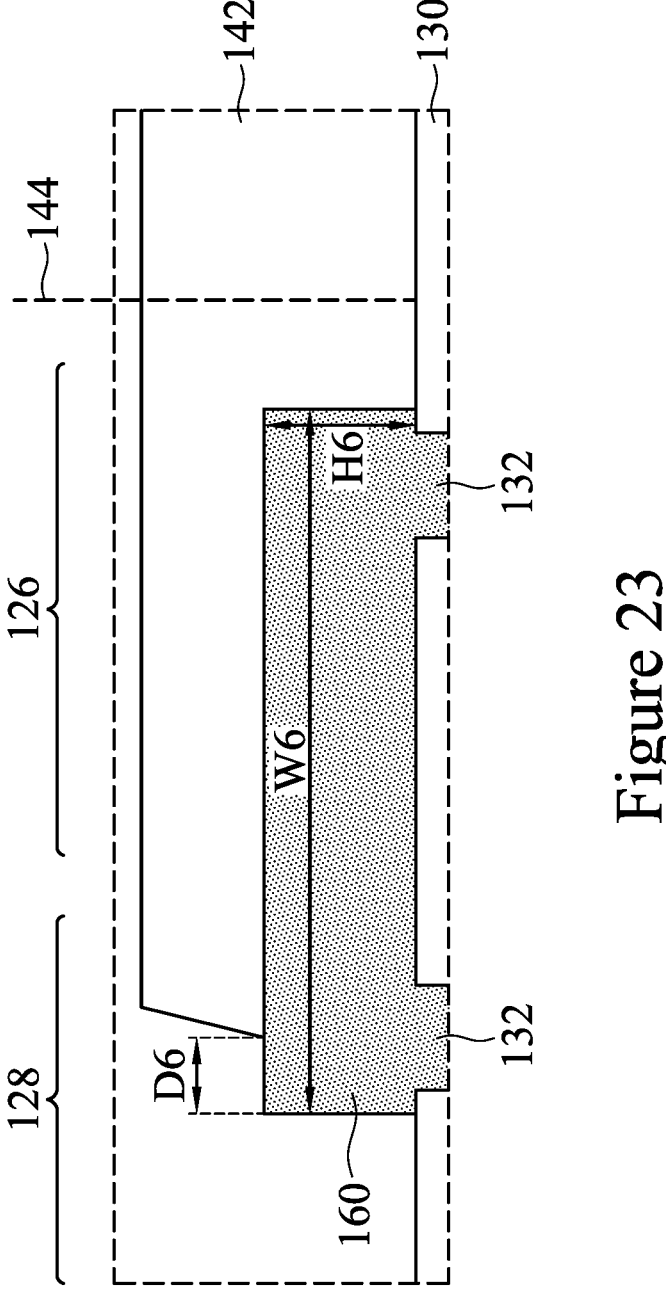

FIG. 23 illustrates a cross-sectional view of an interme-diate stage of manufacturing of a device in accordance with some embodiments.

Figure 24:
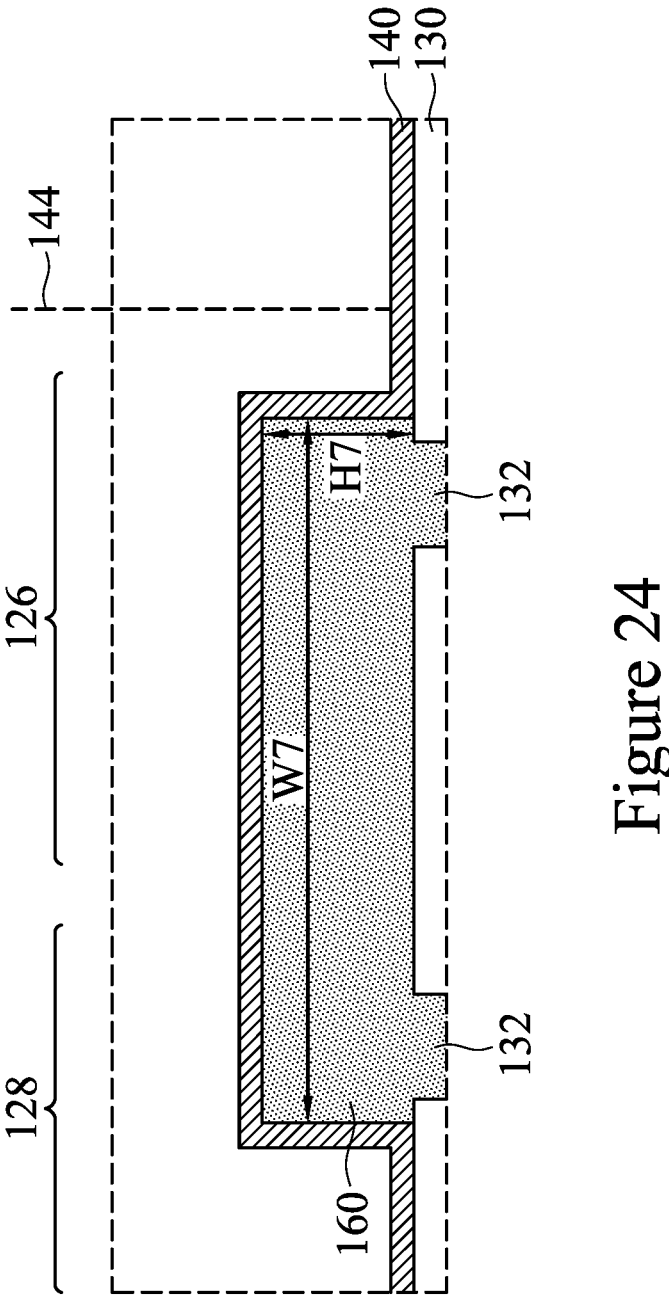

FIG. 24 illustrates a cross-sectional view of an interme-diate stage of manufacturing of a device in accordance with some embodiments.

DETAILED DESCRIPTION

The following disclosure provides many different embodiments, or examples, for implementing different fea-tures of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numer-als and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accord-ingly.

Embodiments of the present disclosure generally include a seal ring structure that improves the step coverage for an overlying seed layer and improves the landing process capability of an overlying insulating layer. This seal ring structure may be formed in the interconnect structure or redistribution structure of a semiconductor package. The disclosed seal ring structure improves the step coverage and uniformity for the overlying seed layer by reducing the aspect ratio (height/spacing) for an opening between seal ring structures. Further, the redistribution layer (RDL) has a large width to improve the overlying insulating layer landing process control. The seed layer uniformity is important for determining the coplanarity of the bumps that are formed on the seed layer. Further, the seed layer may be deposited by a sputtering process, and a smooth seal ring and overlying insulating layer topography enables the seed layer to have good uniformity.

Figure 1:
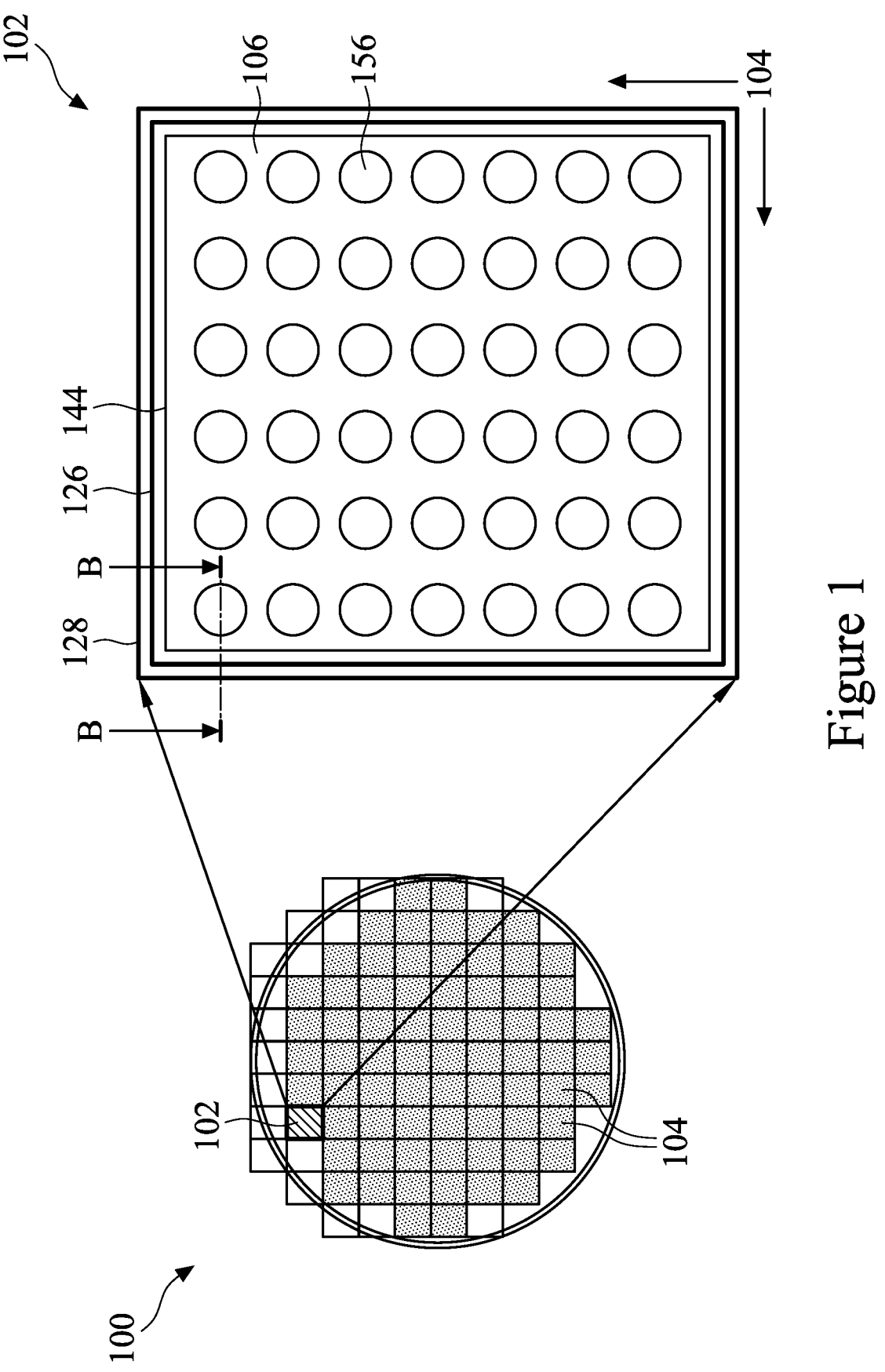
FIG. 1 illustrates a plan view of a wafer in accordance with some embodiments.

FIG. 1 illustrates a plan view of a wafer 100 in accordance with some embodiments. FIG. 1 illustrates a top view of the wafer 100. In FIG. 1, the wafer 100 comprises unit regions 102 separated by scribe lines 104 (also referred to as dicing lines or dicing streets). As described below in greater detail, the wafer 100 is to be diced along the scribe lines 104 to form individual die structure (such as a die structure 202 illustrated in FIG. 16). FIG. 1 further illustrates seal rings 126 and 128 outside of a die edge 144. The die edge 144 is the outermost edge to form an interconnect and/or active devices on a die region. The seal ring 126 and 128 will be discussed in greater detail below.

Although FIG. 1 illustrates a single die region 106 in the unit region 102, in some embodiments, each unit region 102 is a multi-die structure comprising a plurality of die regions. Each of the die regions may comprise an integrated circuit device, such as logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof.

Figure 2:
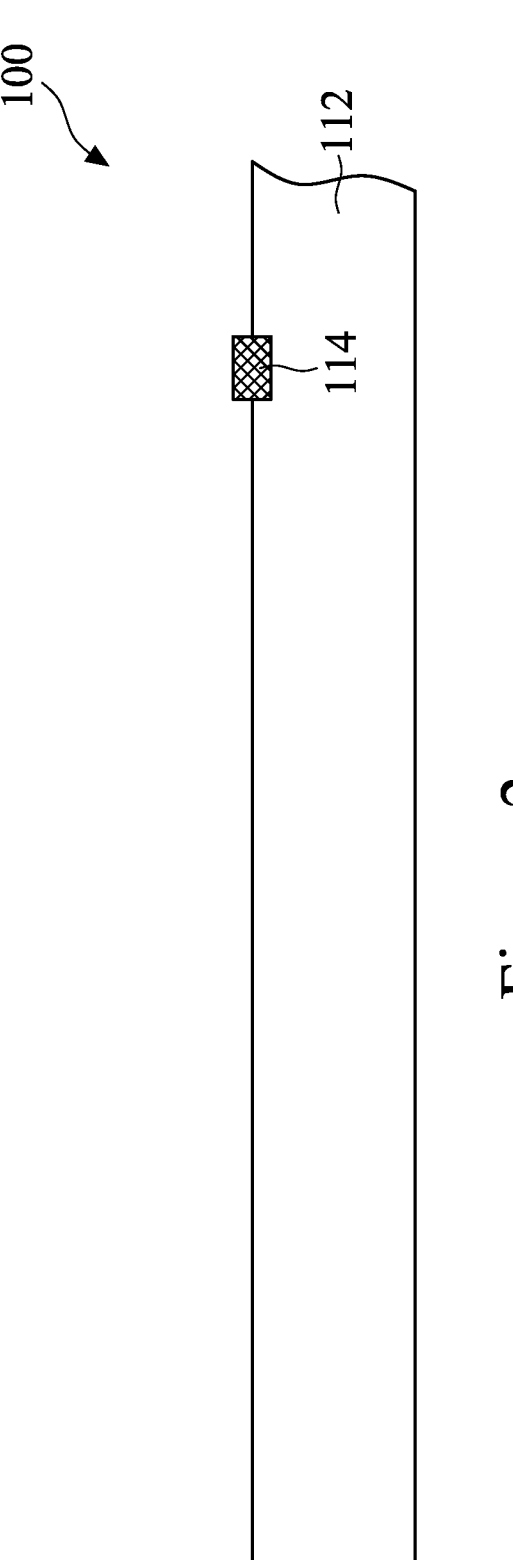
FIGS. 2, 3, 4, 5, 6, 7, 8, 9, 10, 11A, 11B, 12, 13, 14, and 15 illustrate cross-sectional views of intermediate stages in the manufacturing of devices in accordance with some embodiments.

FIGS. 2 through 15 illustrate cross-sectional views of the wafer 100 along a line B-B shown in FIG. 1 in various intermediate stages of manufacturing In FIG. 2, the wafer 100 comprises a substrate 112, one or more active and/or passive devices 114 on the substrate 112. In some embodiments, the substrate 112 may be formed of silicon, although it may also be formed of other group III, group IV, and/or group V elements, such as such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 112 may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

In some embodiments, the one or more active and/or passive devices 114 may include various n-type metal-oxide semiconductor (NMOS) and/or p-type metal-oxide semiconductor (PMOS) devices such as transistors, capacitors, resistors, diodes, photo-diodes, fuses and/or the like.

Figure 3:
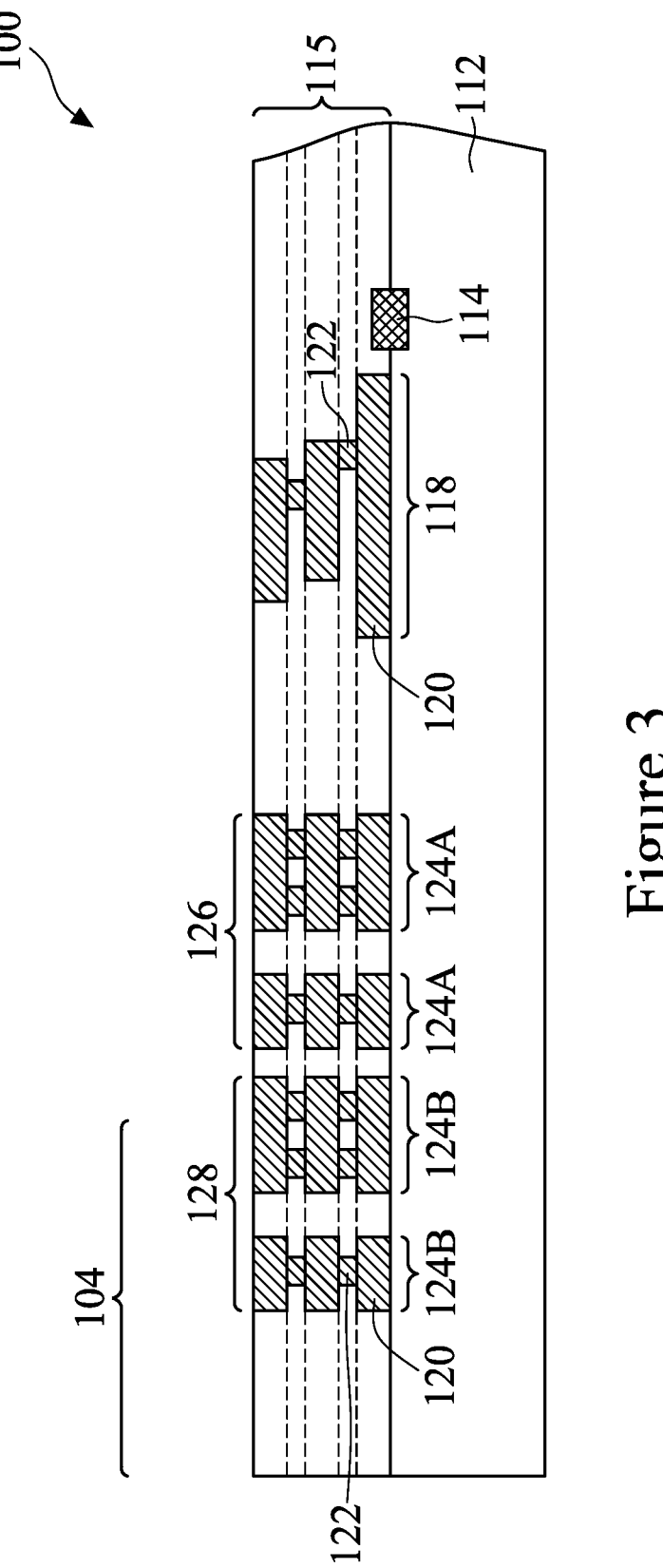

In FIG. 3, dielectric layers 115 are formed over the substrate 112 and the one or more active and/or passive devices 114. The dielectric layers 115 may include an inter-layer dielectric (ILD)/inter-metal dielectric layers (IMDs). The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), the like, or a combination thereof. The dielectric layers 115 may include conductive interconnect structures 118. In some embodiments, the interconnect structures 118 may comprise conductive lines 120 and conductive vias 122. In some embodiment, the interconnect structures 118 may be formed in the dielectric layers 115 using, for example, a damascene process, a dual damascene process, or the like. In some embodiments, the interconnect structures 118 may comprise copper, a copper alloy, silver, gold, tungsten, tantalum, aluminum, the like, or a combination thereof. The interconnect structures 118 electrically interconnect the one or more active and/or passive devices 114 on the substrate 112 to form functional circuits within the die region 106.

Dielectric layers 115 may further include seal ring portions 124A and 124B extending through dielectric layers 115. The seal ring portions 124A may be disposed at edge areas of the die region 106 and, in a plan view, the seal ring portions 124A may encircle or surround interior portions of the die region 106. The seal ring portions 124B may be disposed at edge areas of the unit regions 102 and, in a plan view, the seal ring portions 124B may encircle or surround interior portions of the unit regions 102. Each of the seal ring portions 124B may encircle or surround corresponding seal ring portions 124A. In some embodiments, the seal ring portions 124A and 124B may include conductive lines 120 and conductive vias 122 and may be formed using similar materials and processes as the interconnect structures 118. For example, the same processes used to form the interconnect structures 118 may simultaneously form the seal ring portions 124A and 124B. In some embodiments, the seal ring portions 124A and 124B may comprise copper, a copper alloy, silver, gold, tungsten, tantalum, aluminum, silicon, silicon/aluminum oxide, the like, or a combination thereof. In some embodiments, the seal ring portions 124A and 124B may be electrically isolated from each other. In some embodiments, the seal ring portions 124A and 124B may be electrically isolated from the interconnect structures 118.

Figure 4:
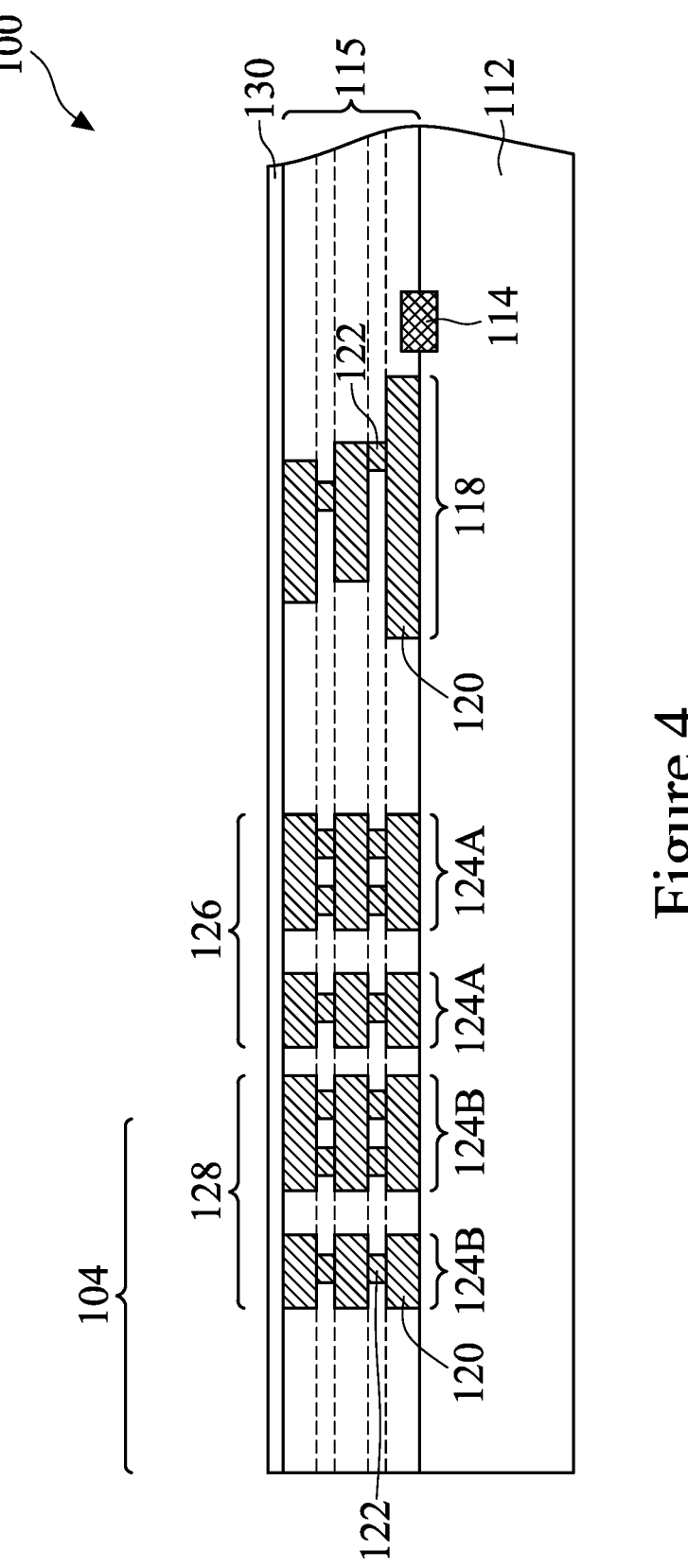

In FIG. 4, a passivation layer 130 is formed over the dielectric layers 115, the interconnect structures 118, and the seal ring portions 124A and 124B. In some embodiments, the passivation layer 130 may comprise one or more layers of non-photo-patternable dielectric materials such as silicon nitride, silicon oxide, phosphosilicate glass (PSG), borosilicate glass (BSG), boron-doped phosphosilicate glass (BPSG), a combination thereof, or the like, and may be formed using CVD, physical vapor deposition (PVD), atomic layer deposition (ALD), a spin-on coating process, a combination thereof, or the like. In other embodiments, the passivation layer 130 may comprise one or more layers of photo-patternable insulating materials such as polybenzoxazole (PBO), polyimide (PI), benzocyclobutene (BCB), or the like, and may be formed using a spin-on coating process, or the like. Such photo-patternable dielectric materials may be patterned using similar photolithography methods as a photoresist material.

Figure 5:
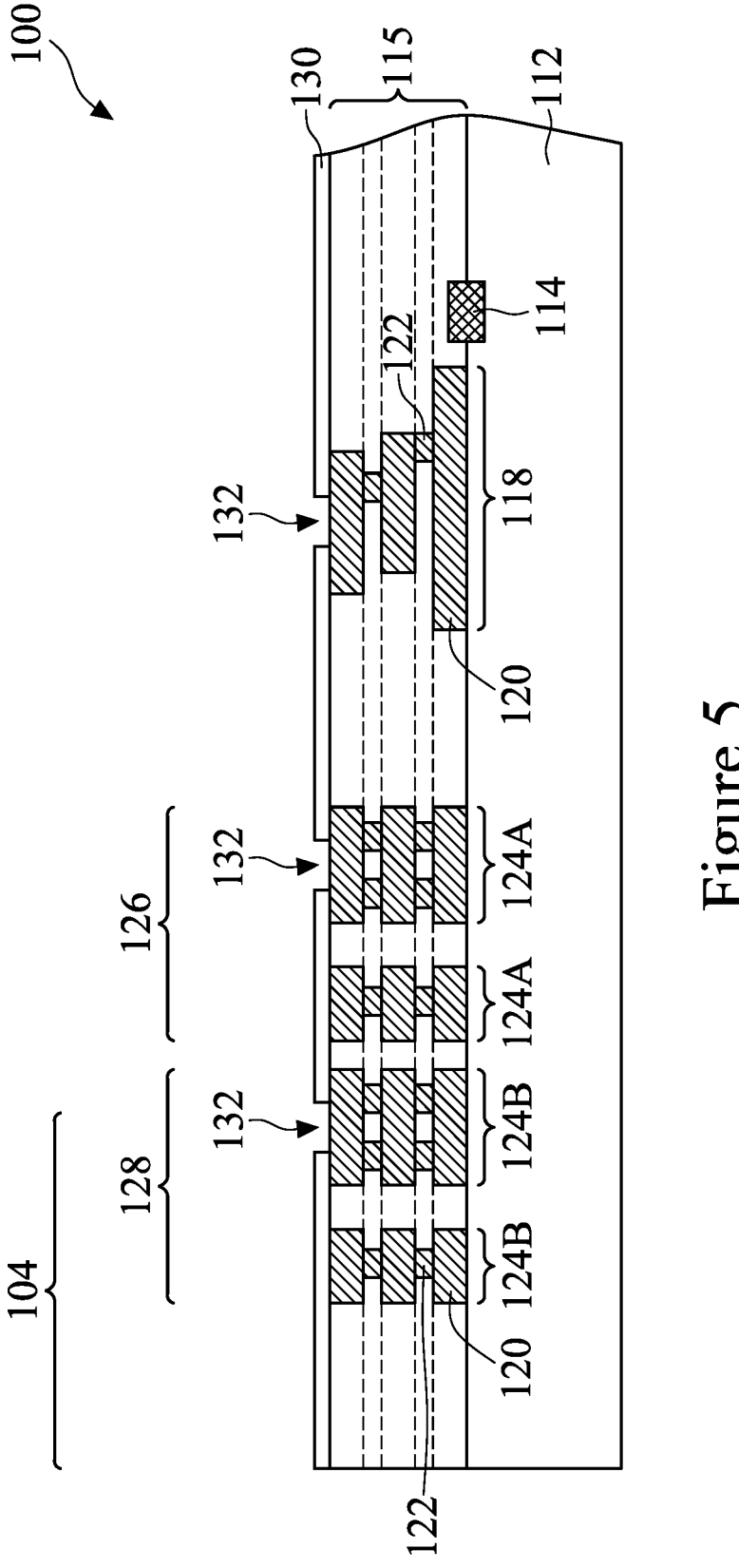

In FIG. 5, openings 132 are formed through the passivation layer 130 to expose portions of the seal ring portions 124A and 124B and interconnect structures 118. The openings 132 may be formed, for example, using laser drilling, etching, or the like. The openings 132 may be referred to as redistribution layer via openings 132 hereinafter.

Figure 6:
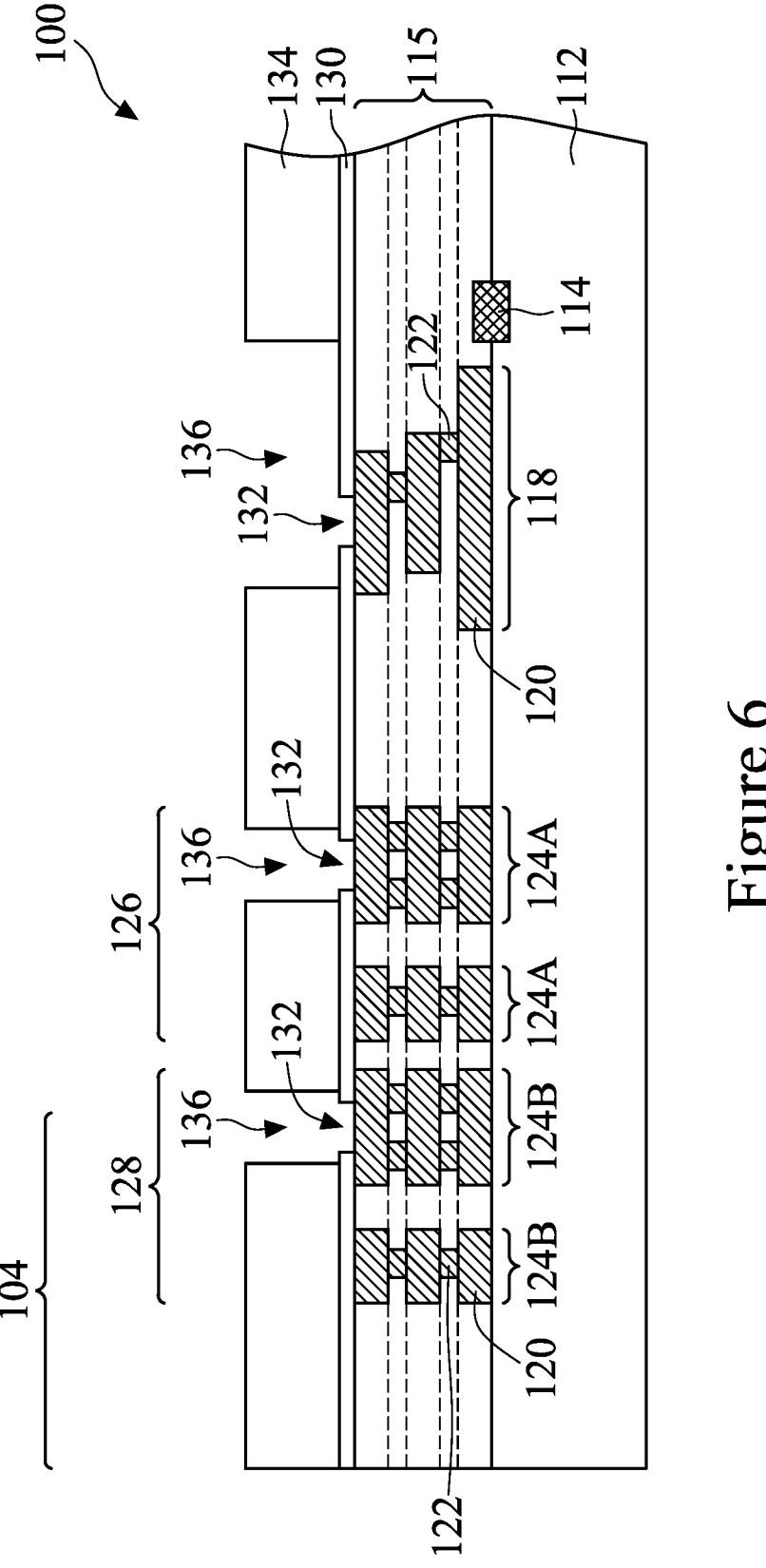
Figure 7:
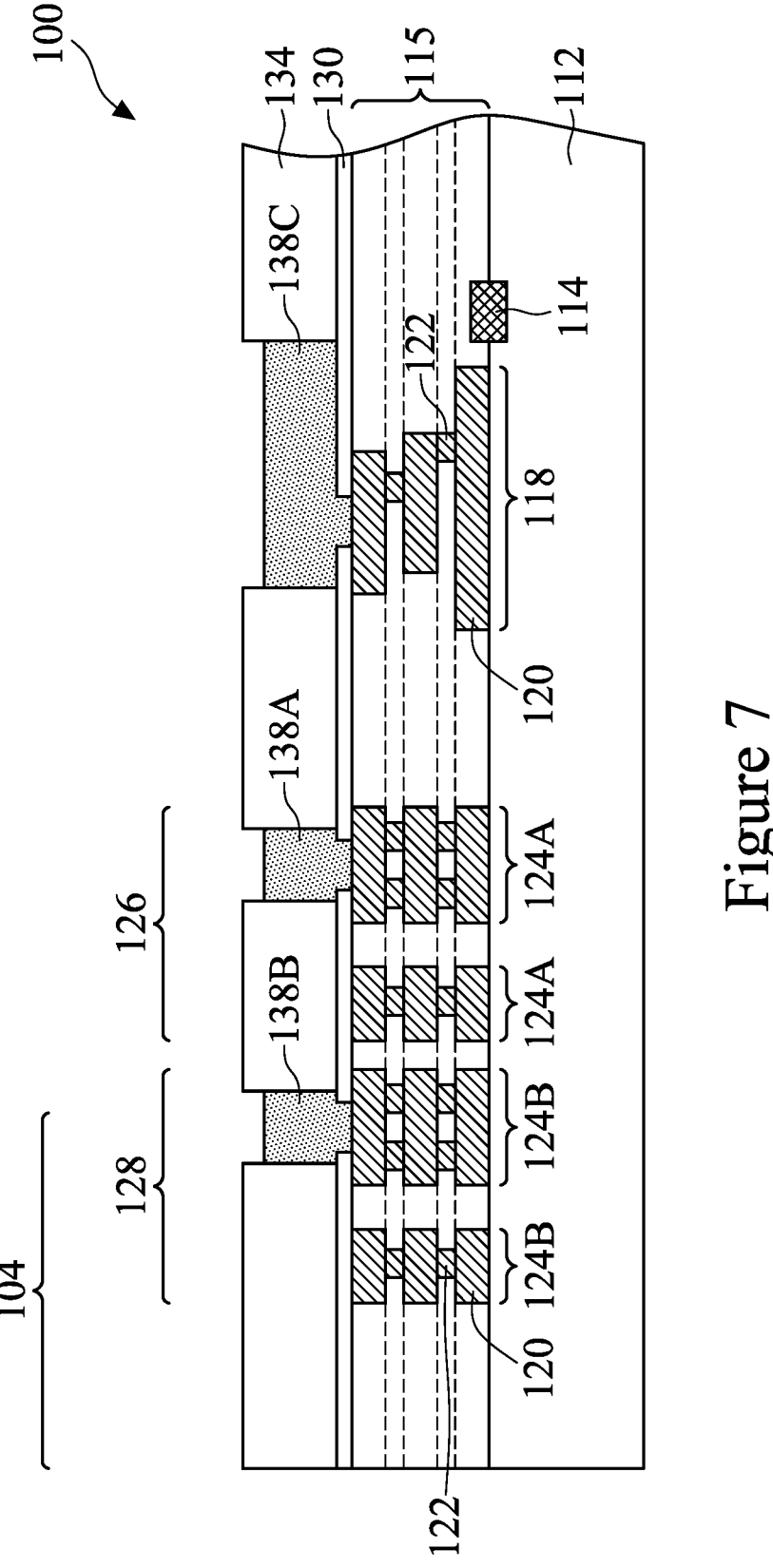
Figure 8:
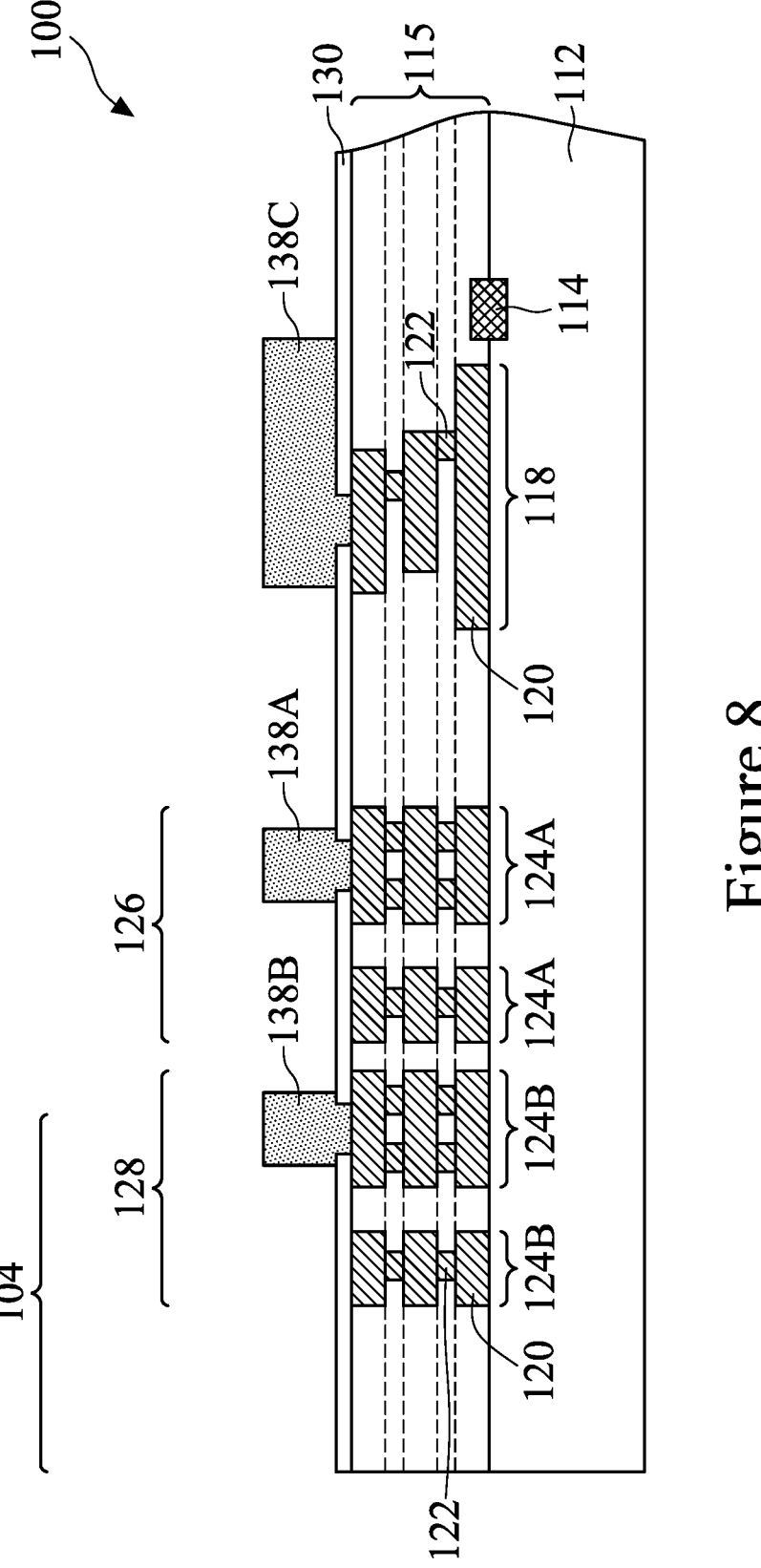

In FIGS. 6, 7, and 8, the redistribution layers 138A, 138B, and 138C are formed over the passivation layer 130. As an example, to form the redistribution layers 138, a seed layer (not shown) is formed over the passivation layer 130. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. In FIG. 6, a mask 134, such as a photo resist 134 (may be referred to as photo resist 134 hereinafter) is then formed and patterned on the seed layer. The photo resist 134 may be formed by spin coating or the like and may be exposed to light for patterning. The pattern of the photo resist 134 corresponds to the redistribution layers 138. The patterning forms openings 136 through the photo resist 134 to expose the seed layer.

In FIG. 7, a conductive material is formed in the openings 136 of the photo resist 134 and on the exposed portions of the seed layer. The conductive material may be formed by plating, such as electroplating or electroless plating, or the like. The conductive material may comprise a metal, like copper, titanium, tungsten, aluminum, gold, silicon, silicon/ aluminum oxide, or the like.

In FIG. 8, the photo resist 134 and portions of the seed layer on which the conductive material is not formed are removed. The photo resist 134 may be removed by an acceptable ashing or stripping process, such as using an oxygen plasma or the like. Once the photo resist 134 is removed, exposed portions of the seed layer are removed, such as by using an acceptable etching process, such as by wet or dry etching. The remaining portions of the seed layer and conductive material form the redistribution layers 138A, 138B, and 138C.

The redistribution layers 138A (also referred to as an inner conductive structure) are physically connected to respective seal ring portions 124A. The redistribution layers 138B (also referred to as an outer conductive structure) are physically connected to respective seal ring portions 124B. The redistribution layers 138C are physically connected to respective interconnect structures 118. Each of the redistribution layers 138A may encircle or surround an interior portion of a respective one of the die regions 106. Each of the redistribution layers 138B may encircle or surround an interior portion of a respective one of the unit regions 102.

The seal ring portions 124A and the redistribution layers 138A form a seal ring 126 encircling an interior portion of a respective one of the die regions 106. The seal ring portions 124B and the redistribution layers 138B form a seal ring 128 encircling an interior portion of a respective one of the unit regions 102. Each of the seal rings 128 encircles respective ones of the seal rings 126. In some embodiments, the seal rings 126 and 128 may be electrically isolated from each other. In some embodiments, the seal rings 126 and 128 may be electrically isolated from the interconnect structures 118. In some embodiments, the seal rings 126 and 128 may have a substantially similar structure. In other embodiments, the seal rings 126 and 128 may have different structures.

Figure 9:
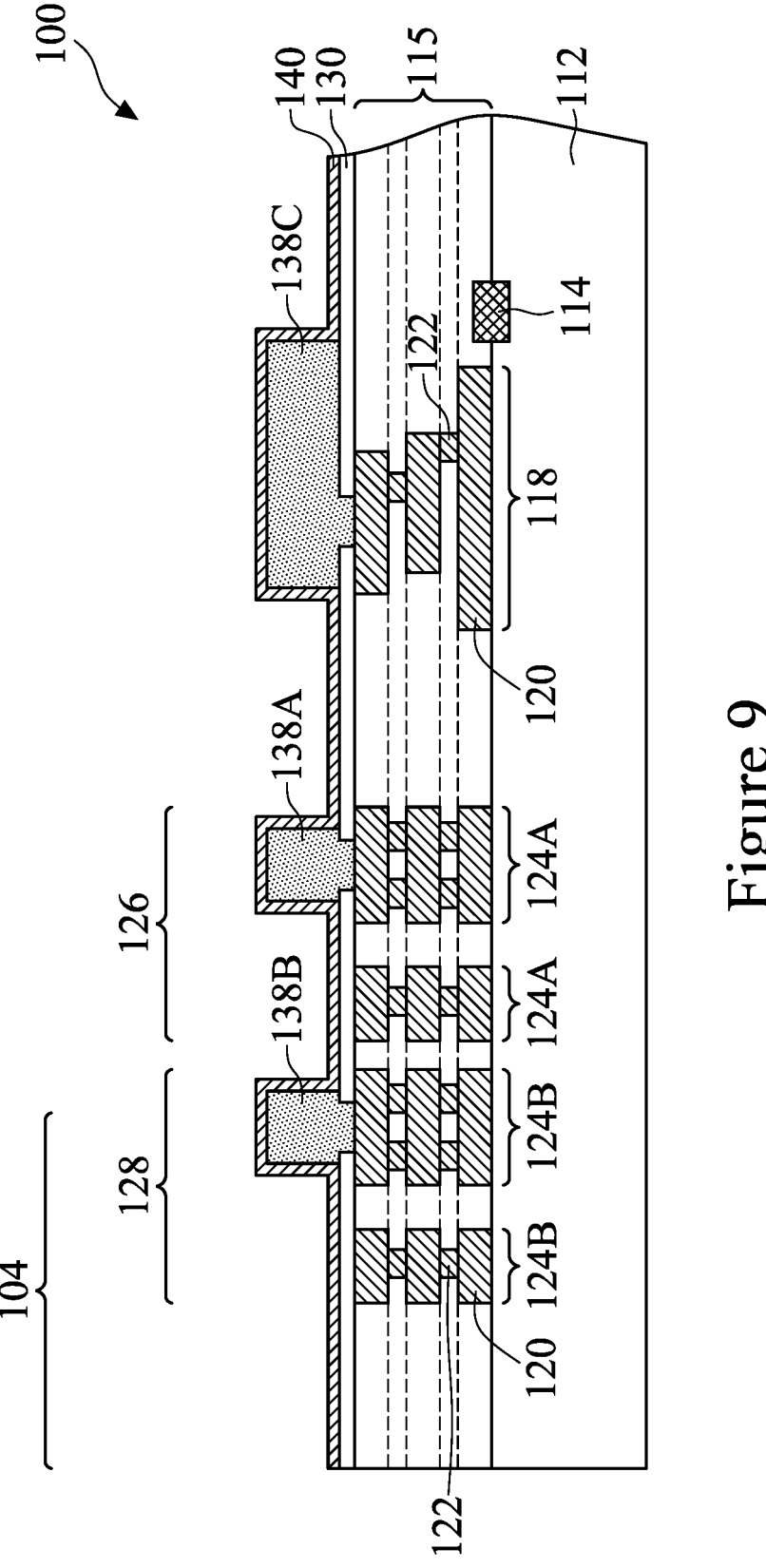

In FIG. 9, a passivation layer 140 is formed over the redistribution layers 138A, 138B, and 138C. The passivation layer 140 may be formed using similar materials and methods as the passivation layer 130 and description is not repeated herein. In some embodiments, the passivation layer 140 and the passivation layer 130 comprise a same material. In other embodiments, the passivation layer 140 and the passivation layer 130 comprise different materials. The passivation layer 140 may be deposited using conformal deposition methods such as ALD or CVD so that the thickness of the vertical portions and the thickness of the horizontal portions of the passivation layer 140 are substantially equal to each other.

Figure 10:
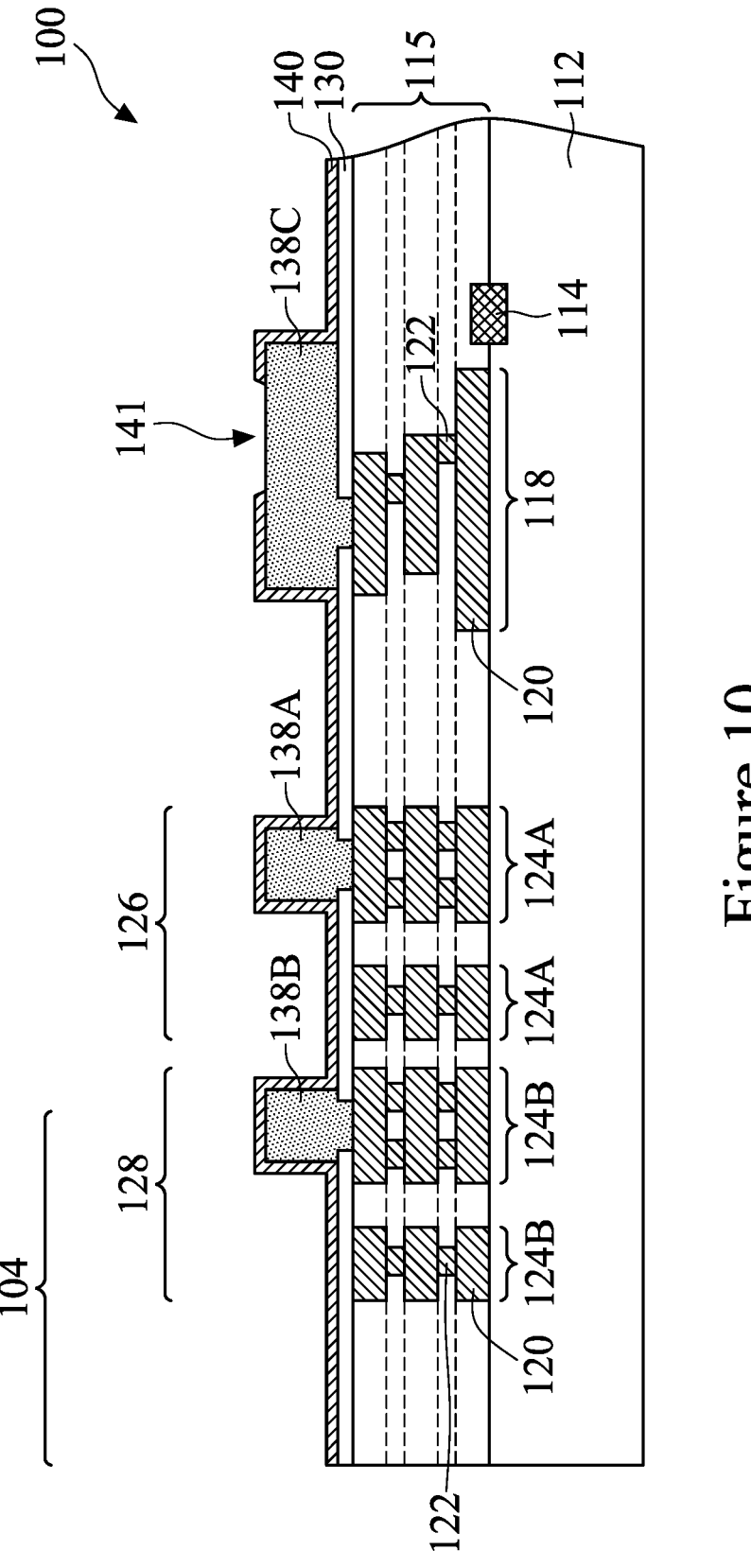

In FIG. 10, an opening 141 is formed in the passivation layer 140 to expose a portion of the redistribution layer 138C. In some embodiments where the passivation layer 140 comprises a non-photo-patternable dielectric material, the passivation layer 140 may be patterned using suitable photolithography and etching methods.

Figure 11A:
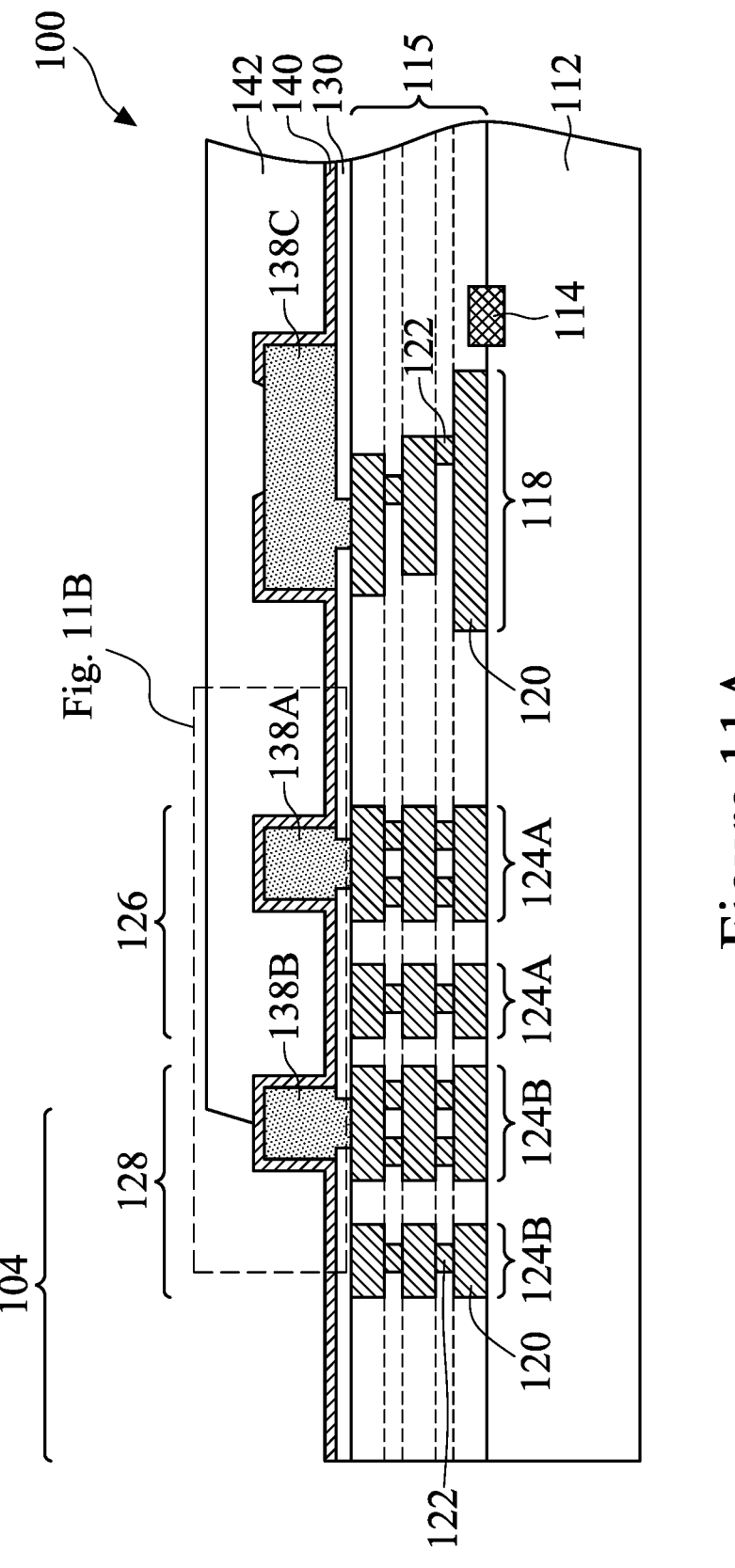
Figure 11B:
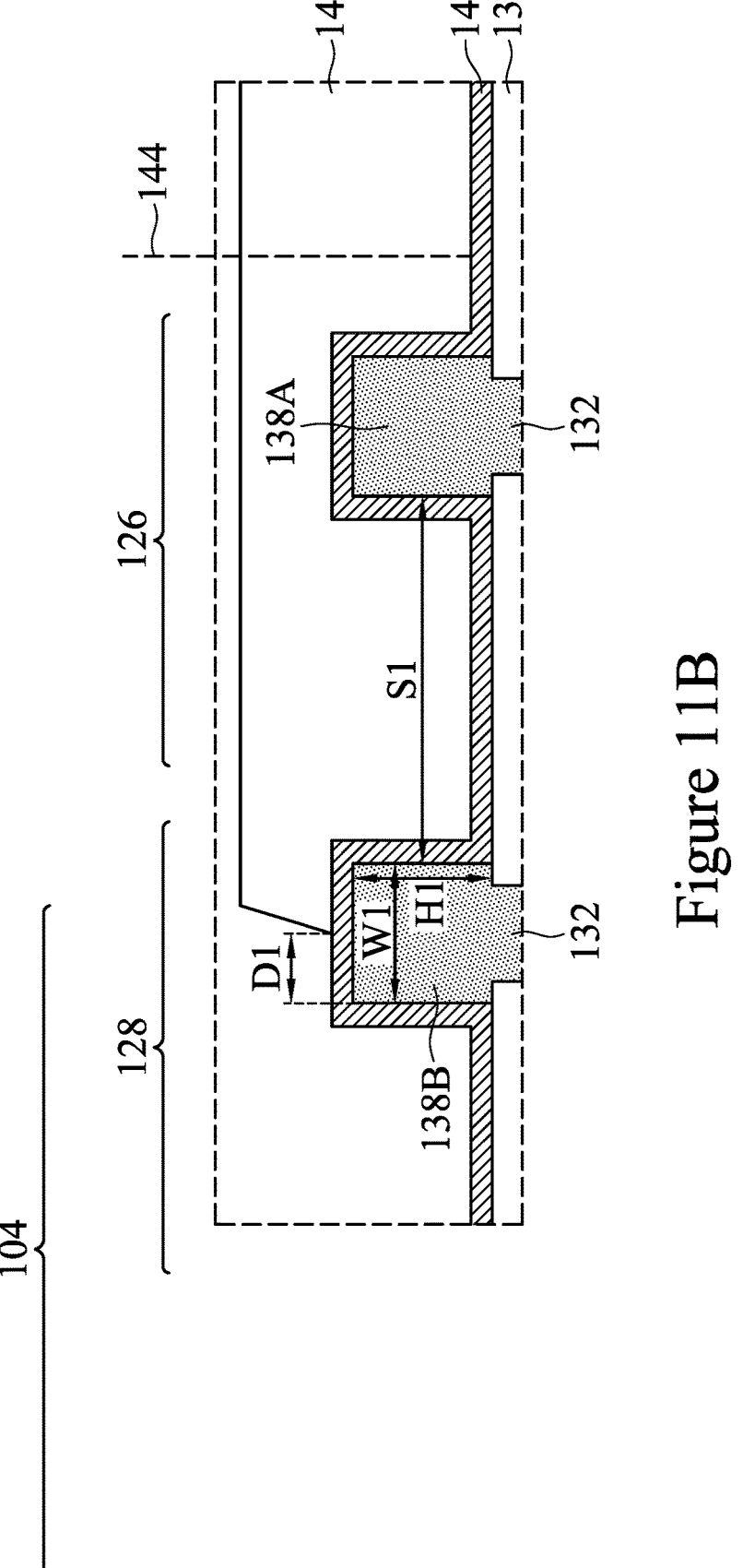

In FIG. 11A, a buffer layer 142 is formed over the passivation layer 140 and in the opening 141. The buffer layer 142 may be one or more polymer layers. The buffer layer 142 may comprise one or more layers of photo-patternable insulating materials such as polybenzoxazole (PBO), polyimide (PI), benzocyclobutene (BCB), a combination thereof, or the like, and may be formed using a spin-on coating process, or the like. In this embodiment, the buffer layer 142 fully covers the passivation layer 140 over the redistribution layers 138C and the seal ring 126, while the buffer layer 142 only partially covers the passivation layer 140 over the seal ring 128. The buffer layer 142 covers the redistribution layer 138A of the seal ring 126 and partially covers the redistribution layer 138B of the seal ring 128. In some embodiments, the buffer layer 142 fills the area between the redistribution layer 138A and 138B. While the buffer layer 142 is illustrated to have a planar top surface, in some embodiments, the buffer layer 142 may have a non-planar surface that is somewhat conformal to the underlying redistribution layers 138A, 138B, and 138C. FIG. 11B illustrates a detailed view of a portion of FIG. 11A.

In FIG. 11B, the outermost sidewall/edge of the buffer layer 142 is overlying the redistribution layer 138B of the seal ring structure 128 such that the buffer layer 142 fills the opening between the redistribution layer 138A of the seal ring structure 126 and the redistribution layer 138B of the seal ring structure 128. The redistribution layer 138B width (W1) that is greater than or equal to about 4 μm. This enables good landing process capability control for the overlying buffer layer 142 based on the accuracy capability of the exposure tool (accuracy ±2 μm). In some embodiments, the redistribution layer 138B has a height H1 as measured from a top surface of the passivation layer 130 to a top surface of the redistribution layer 138B. In some embodiments, the aspect ratio (H1/S1) of the opening between the redistribution layers 138A and 138B is less than about 3. In some embodiments, the aspect ratio (H1/S1) of the opening between the redistribution layers 138A and 138B is less than about 2. In some embodiments, the aspect ratio (H1/S1) of the opening between the redistribution layers 138A and 138B is less than about 1. The aspect ratio (H1/S1) of the opening between the redistribution layers 138A and 138B being less than about 1 enables good step coverage for an overlying seed layer used to for the bumps. Also, in this embodiment, the distance (D1) between the edge of the buffer layer 142 and the outermost edge of the redistribution layer 138B is less than or equal to half the width (W1) of the redistribution layer 138B. In some embodiments, the redistribution layers 138B and 138A each have the height H1 and the width W1.

Figure 12:
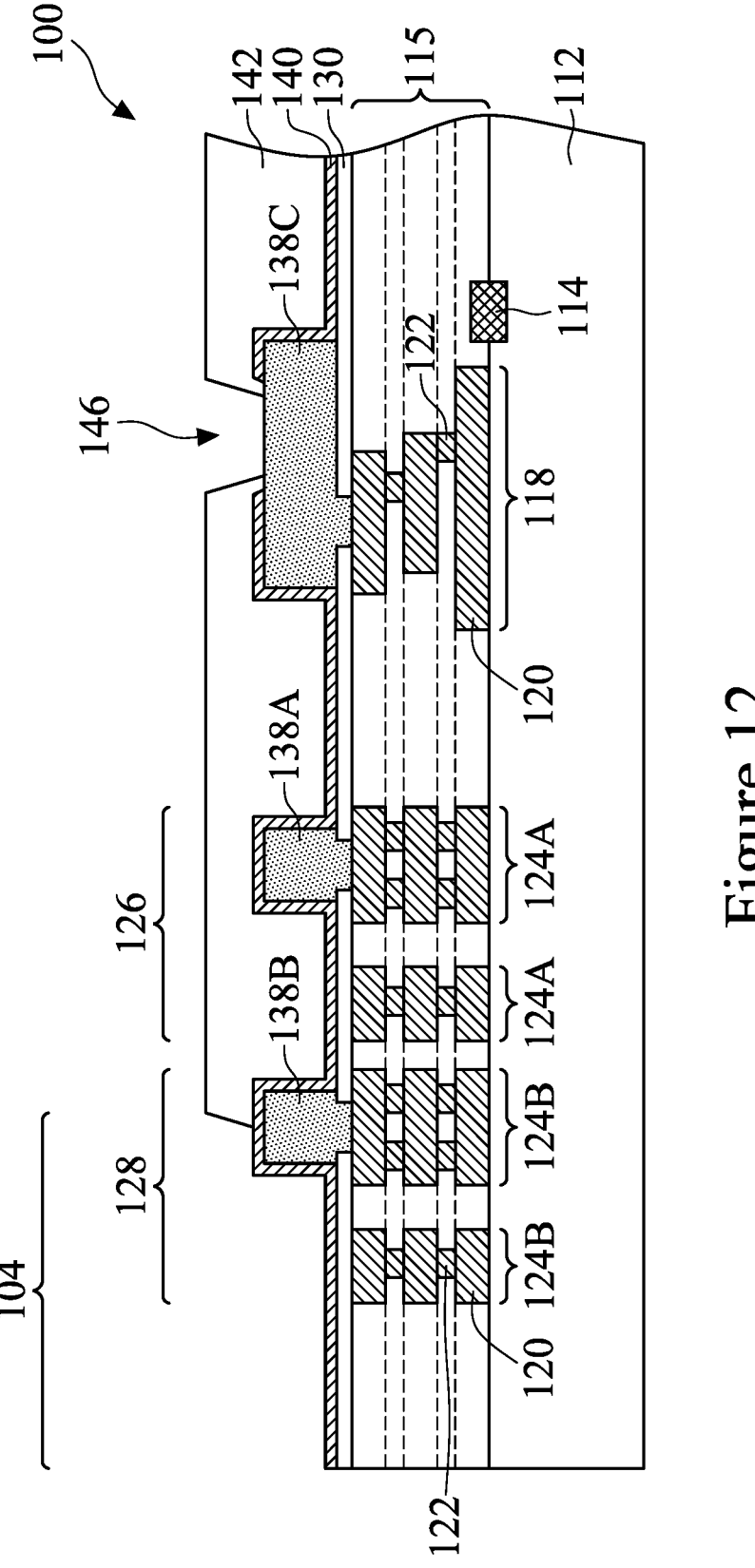

In FIG. 12, openings 146 are formed through the buffer layer 142 to expose portions of the redistribution layers 138C. The openings 146 may be formed, for example, using laser drilling, etching, or the like.

Figure 13:
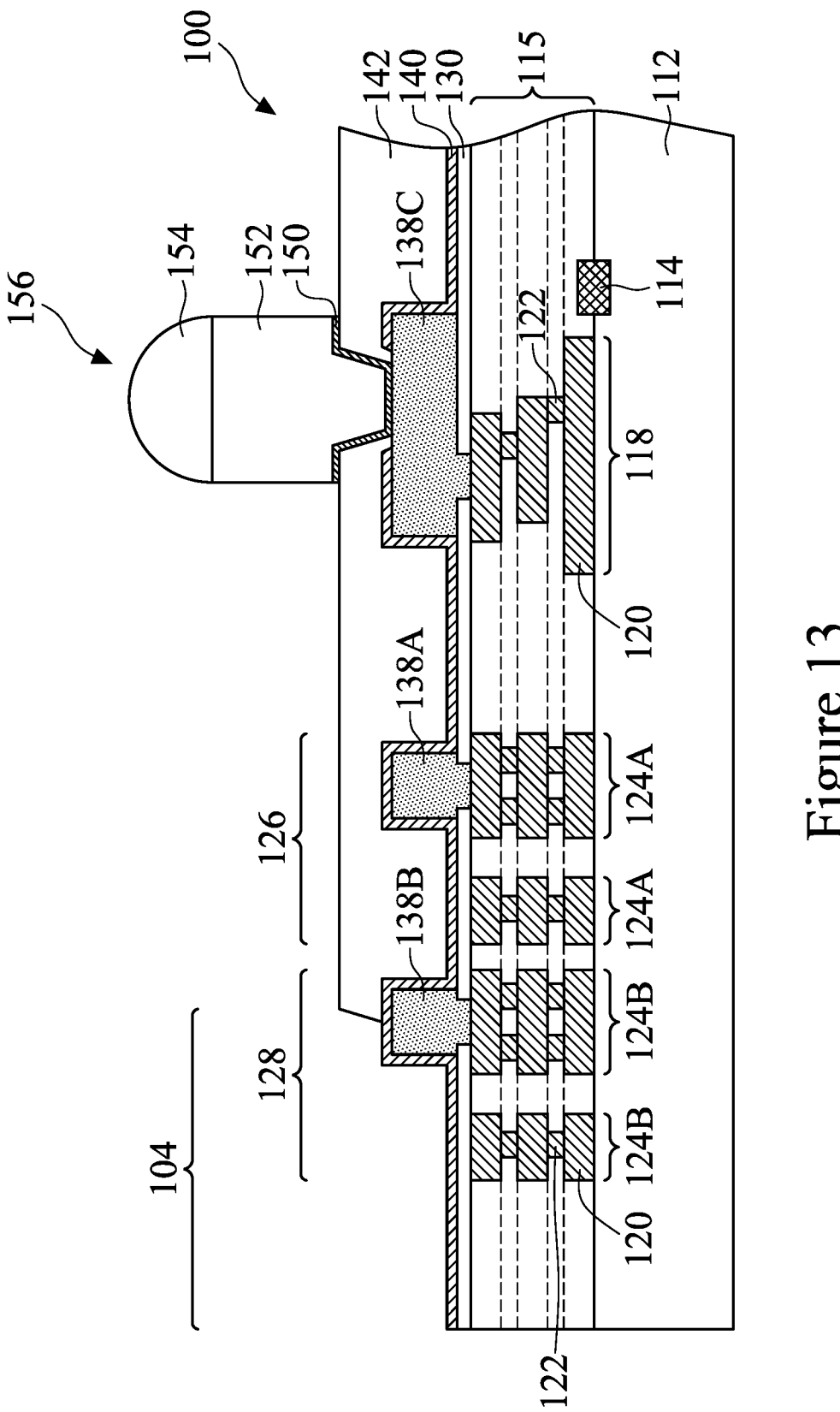

In FIG. 13, conductive connectors 156 are formed over and electrically coupled to respective redistribution layers 138C. In some embodiments, each of the conductive connectors 156 extends through the buffer layer 142 and the passivation layer 140 and physically contacts a respective one of the redistribution layers 138C. In some embodiments, each of the connectors 156 comprises an under-bump metallurgy (UBM) layer 150, a conductive pillar 152 over the UBM layer 150, and a solder layer 154 over the conductive pillar 152. The conductive connectors 156 may be referred to as conductive pillars 156 or micro bumps 156 hereinafter.

The UBM layer 150 and conductive pillar 152 are formed through the openings 146 through the buffer layer 142 to the redistribution layer 138C. As an example, to form the UBM layer 150, a seed layer (not shown) is formed over the buffer layer 142 and the passivation layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the UBM layer 150 and the conductive pillar 152. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like.

After the UBM layer 150 is formed, the conductive pillars 152 and the solder layer 154 may be formed in the pattern of the photo resist. The conductive pillars 152 comprise a conductive material such as copper, tungsten, aluminum, silver, gold, a combination thereof, or the like. The conductive pillars 152 may be solder free and have substantially vertical sidewalls. In some embodiments, a metal cap layer (not shown) is formed on the top of the metal pillar connectors 152. The metal cap layer may include nickel, tin, tin-lead, gold, silver, palladium, indium, nickel-palladium-gold, nickel-gold, the like, or a combination thereof and may be formed by a plating process. In some embodiments, the conductive pillar 152 partially fills the opening in the photo resist and a remaining portion of the opening is filled with a solder material to form the solder layer 154 over the conductive pillars 152.

In some embodiments, the solder layer 154 comprises suitable solder materials. The solder materials may be lead-based solders such as PbSn compositions, lead-free solders including InSb, tin, silver, and copper ("SAC") compositions, and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free solders also include SnCu compounds, without the use of silver (Ag), and SnAg compounds, without the use of copper (Cu). In some embodiments, the solder material may be formed using evaporation, an electrochemical plating process, an electroless plating process, printing, solder transfer, a combination thereof, or the like.

After formation of the conductive pillar 152 and the solder layer 154, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. After removing exposed portions of the UBM layer 150, a reflow process is performed on the solder layer 154 to reshape the solder material of the solder layer 154 into a desired shape. The remaining portions of the seed layer and conductive material form the conductive connector 156. In the embodiment, where the conductive connector 156 are formed differently, more photo resist and patterning steps may be utilized.

For example, in another embodiment, the conductive connectors 156 are bump structures, such as a solder bump. The conductive connectors 156 may be ball grid array (BGA) connectors, solder balls, controlled collapse chip connection (C4) bumps, electroless nickel-electroless palladium-immersion gold technique (ENEPIG) formed bumps, or the like. In this embodiment, the conductive connectors 156 may include a conductive material such as solder, copper, aluminum, gold, nickel, silver, palladium, tin, the like, or a combination thereof. In this embodiment, the conductive connectors 156 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

Figure 14:
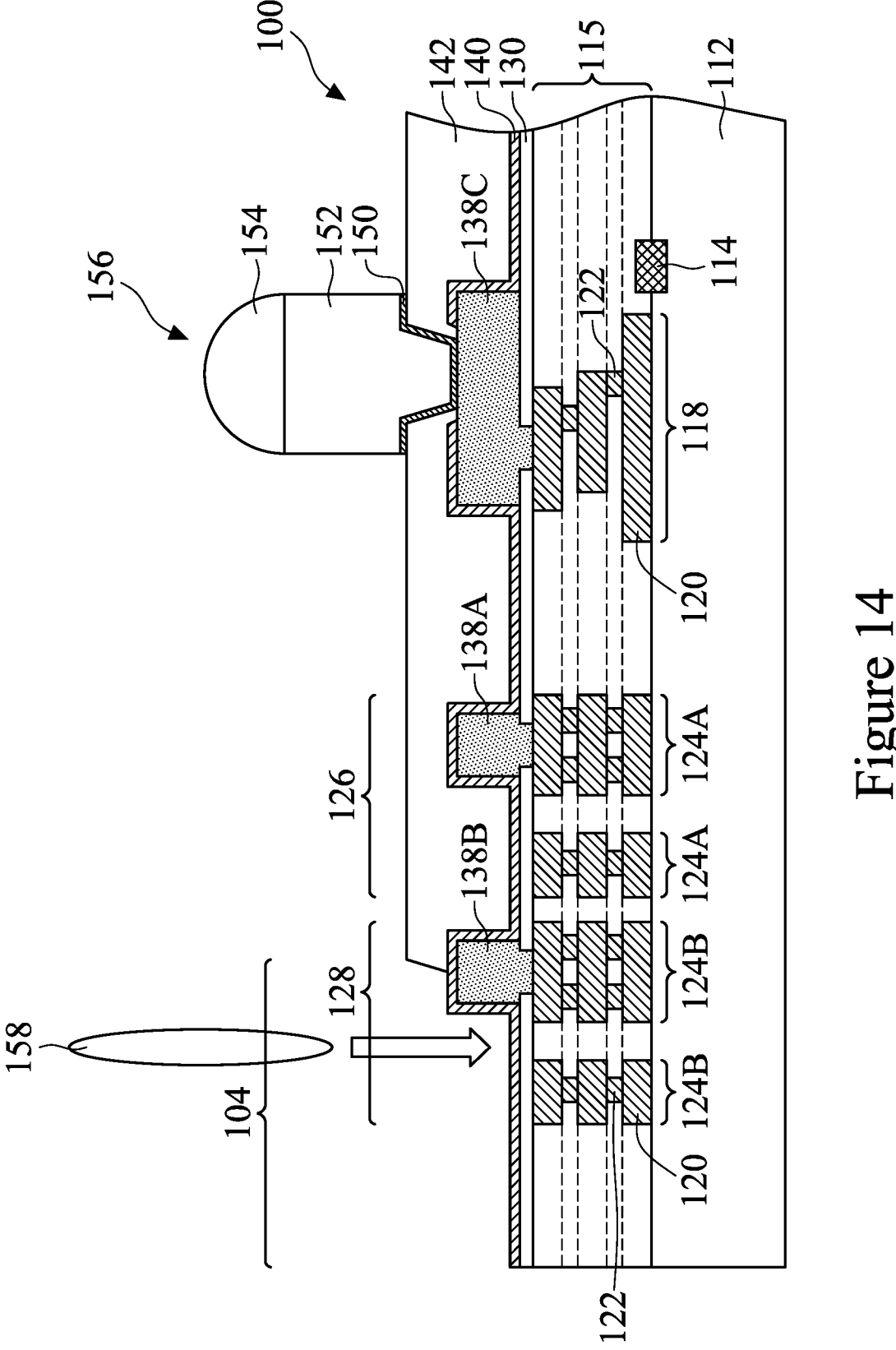
Figure 15:
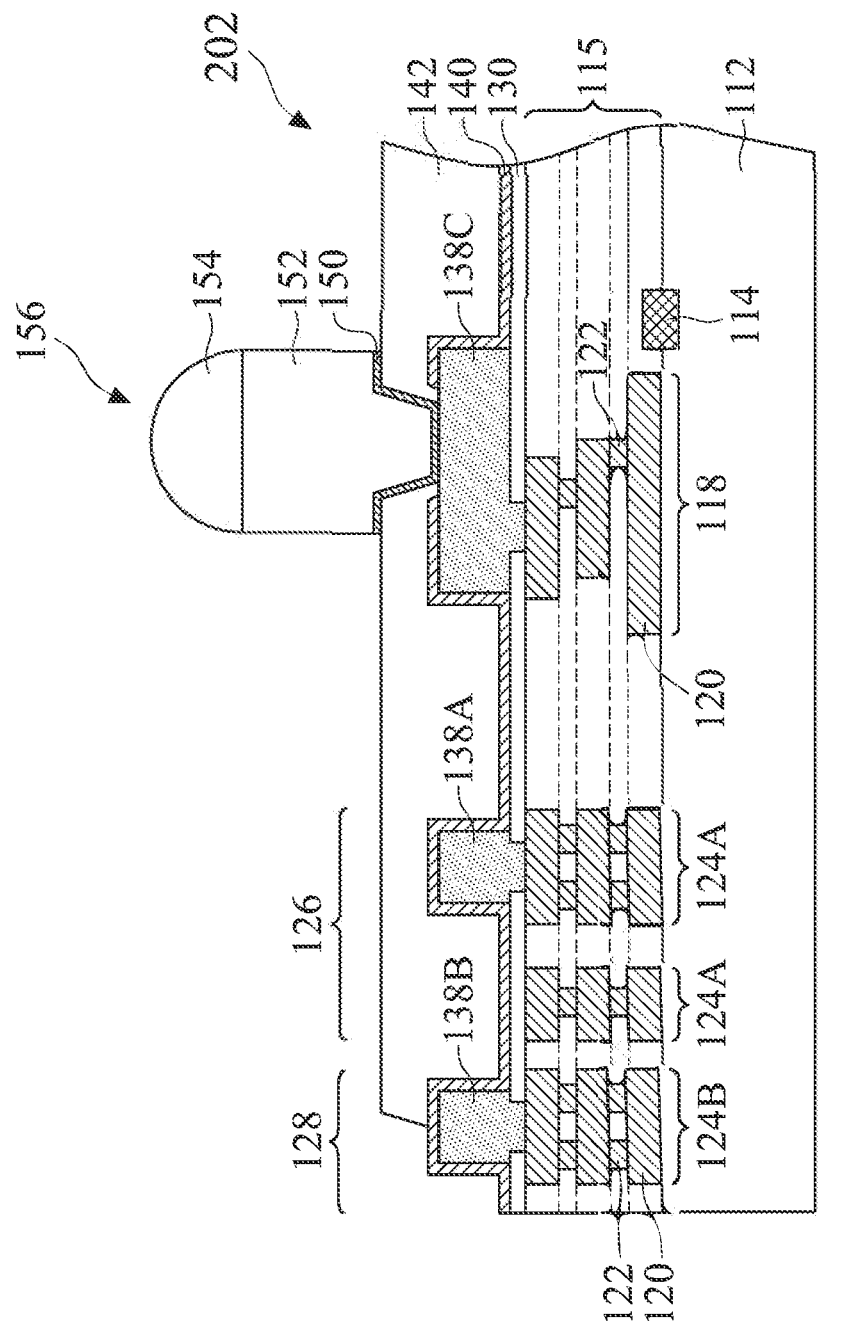
Figure 16:
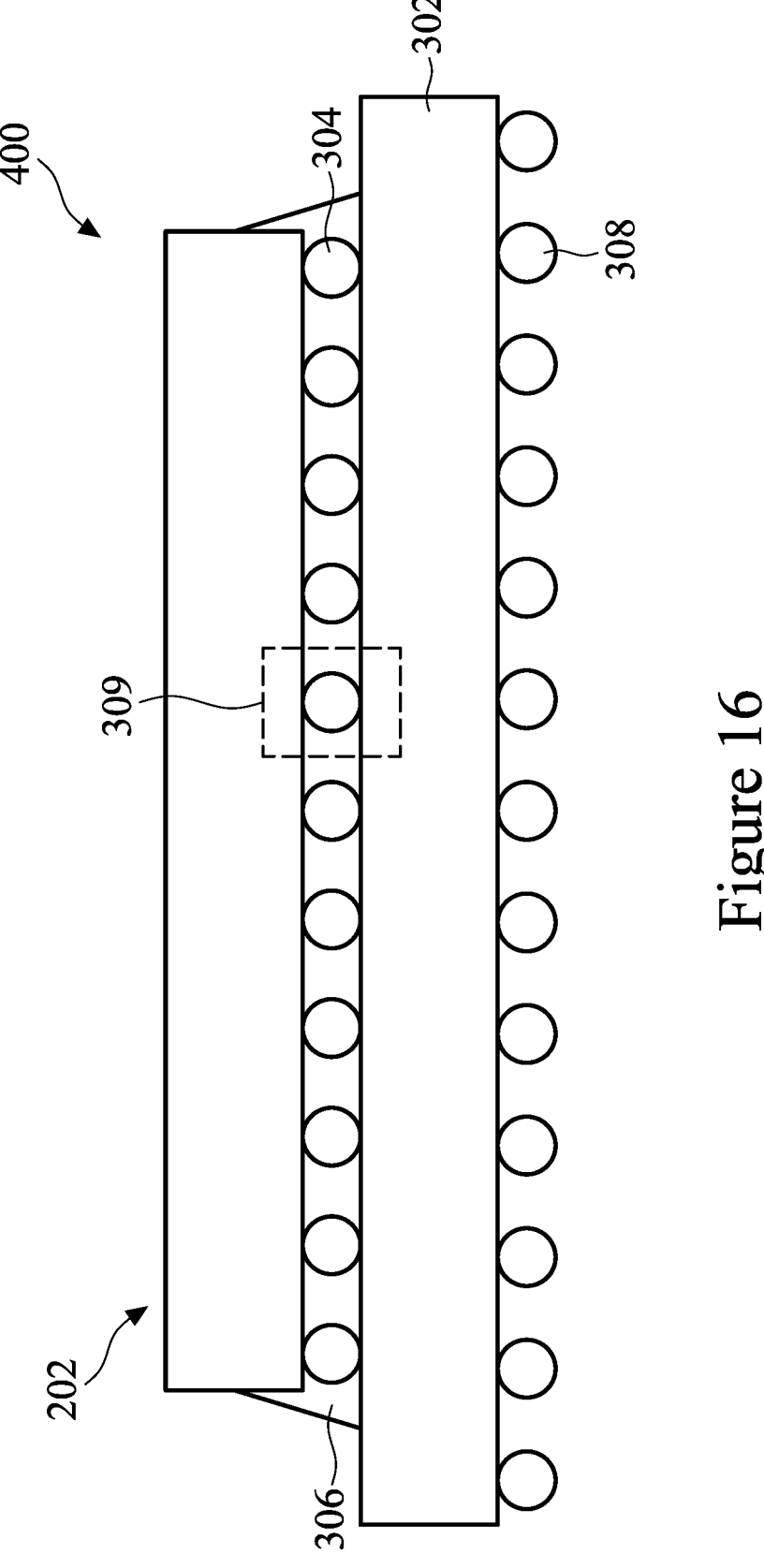
FIG. 16 illustrates a cross-sectional view of a package in accordance with some embodiments.

Referring to FIGS. 1 and 14, after forming the connectors 156 on the wafer 100, the unit regions 102 are singulated along the scribe lines 104, through the seal ring 128, and adjacent the seal ring 126 to form individual die structures, such as a die structure 202 illustrated in FIGS. 15 and 16. A singulation process 158 may comprise a sawing process, an etching process, a laser ablation process, a combination thereof, or the like. The remaining portions of the seal ring 128 and the seal ring 126 protect various features of the unit regions 102 during singulation and may reduce or prevent the formation of defects (e.g., delamination, cracking, and the like).

FIG. 16 illustrates a cross-sectional view of a package 400 in accordance with some embodiments. The package 400 comprises the die structure 202 attached to a substrate 302 using bonding structures 304. An underfill material 306 is formed between the die structure 202 and the substrate 302 and around the bonding structures 304. The underfill material 306 may, for example, be a liquid epoxy, deformable gel, silicon rubber, or the like, that is dispensed between the structures, and then cured to harden. This underfill material 306 may be used, among other things, to reduce damage to and to protect the bonding structures 304. Process steps for bonding the die structure 202 to the substrate 302 and for forming the bonding structures 304 are illustrated below with reference to FIGS. 17 and 18, and the detailed description is provided at that time.

In some embodiments, the substrate 302 may include a portion of semiconductor wafer similar to the substrate 112 described above with reference to FIG. 2, and the description is not repeated herein. In some embodiments, the substrate 302 also includes passive devices such as resistors, capacitors, inductors and the like, or active devices such as transistors. In some embodiments, the substrate 302 includes additional integrated circuits. The substrate 302 may further include through substrate vias (TSVs) and may be an interposer. In some embodiments, the substrate 302 may be a package substrate, a packaged die, a die structure, or the like. In some embodiments, the substrate 302 further includes connectors 308 that may be used to mechanically and electrically connect the package 400 to external components such as a die structure, a printed circuit board, another package, or the like. In some embodiments, the connectors 308 may be solder balls, controlled collapse chip connection (C4) bumps, ball grid array (BGA) balls, micro bumps, electroless nickel-electroless palladium-immersion gold technique (ENEPIG) formed bumps, or the like.

Figure 17:
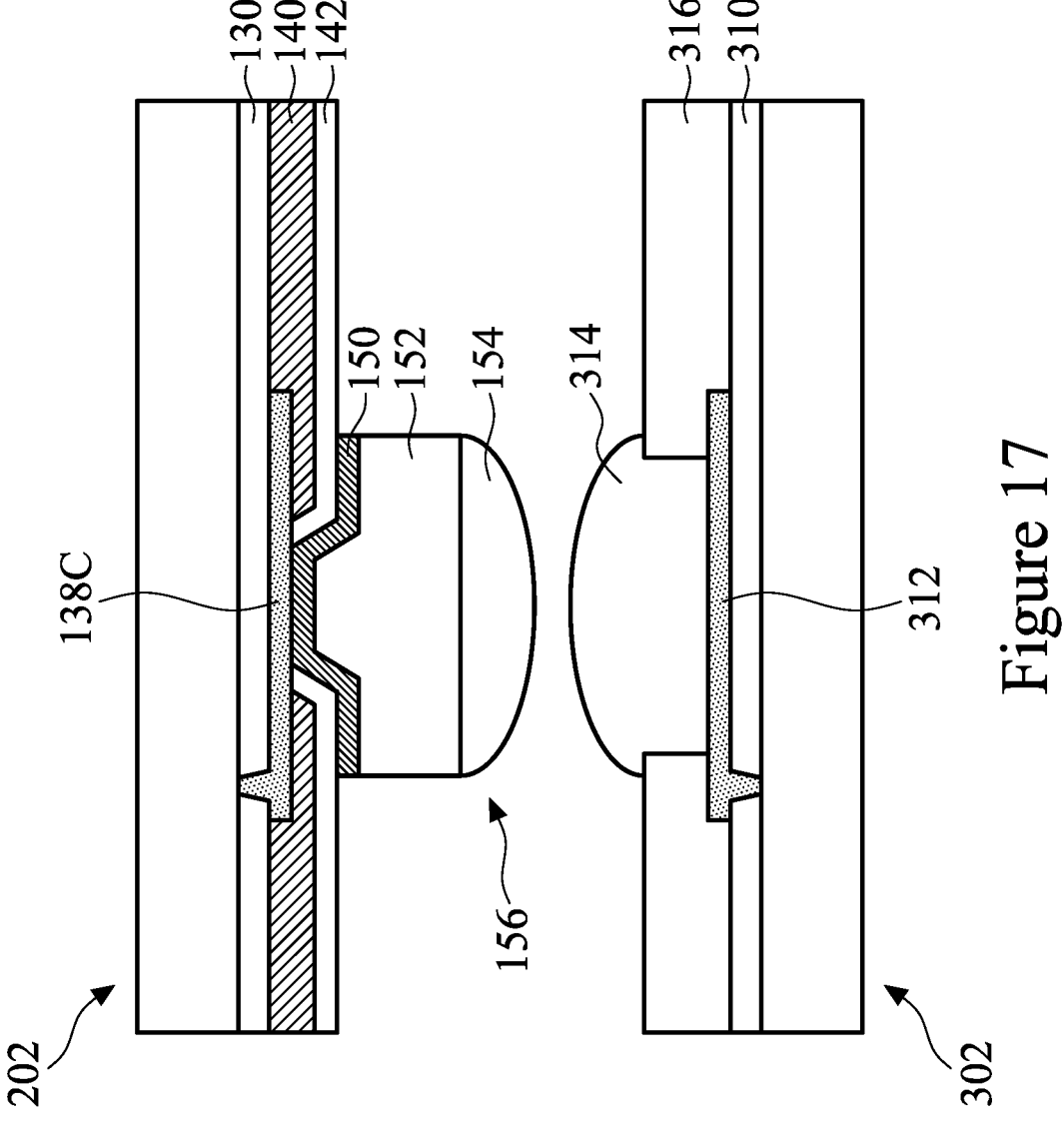
FIGS. 17 and 18 illustrate the cross-sectional views of intermediate stages in the formation of a package and bonding structures in accordance with some embodiments.
Figure 18:
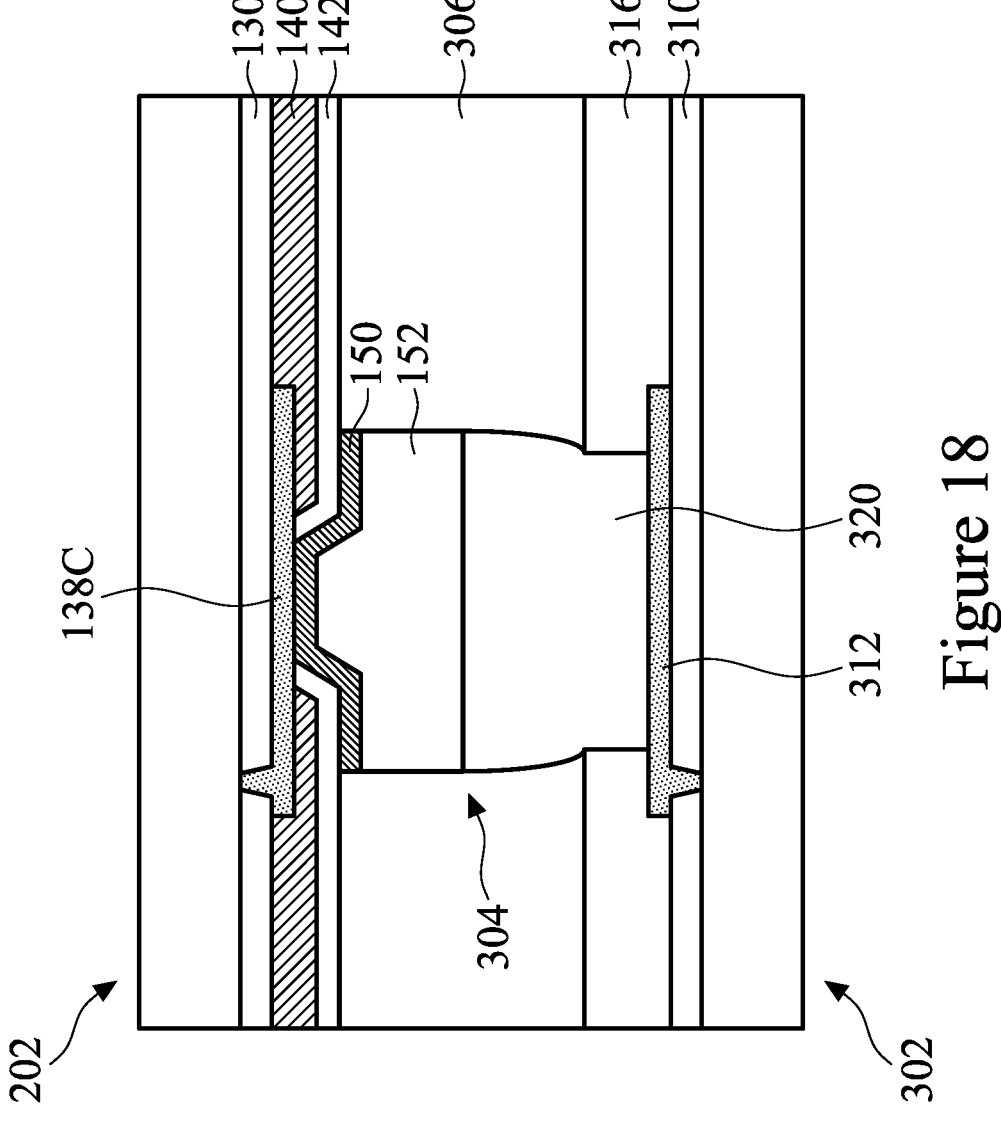

FIGS. 17 and 18 illustrate the cross-sectional views of intermediate stages in the formation of the package 400 and the bonding structures 304 (see FIG. 16) in accordance with some embodiments. FIGS. 17 and 18 illustrate a magnified view of portions the substrate 302 and the die structure 202, which are to become a portion 309 of the package 400 (see FIG. 16) after the bonding process is completed. FIG. 17 illustrates a relative position of the die structure 202 and the substrate 302 prior to performing the bonding process to form the package 400. The substrate 302 may comprise conductive pads, such as a conductive pad 312, interposed between the passivation layers 310 and 316. In some embodiments, the passivation layers 310 and 316 may be formed using similar materials and methods as the passivation layer 130 described above and the description is not repeated herein. The conductive pad 312 may be formed using similar materials and methods as the redistribution layer 138C described above and the description is not repeated herein. The conductive pad 312 is partially covered by the passivation layer 316. A solder layer 314 is formed over the conductive pad 312 to fill an opening formed in the passivation layer 316 for subsequent bonding with the solder layer 154 or the conductive pillar 152 (if the solder layer 154 is omitted) of the corresponding connector 156 of the die structure 202. The solder layer 314 may be formed using similar materials and methods as the solder layer 154 described above and the description is not repeated herein.

Referring to FIG. 18, the solder layers 154 and 314 are brought into physical contact and a reflow process is performed to merge the solder layers 154 and 314 into a common solder layer 320, which bonds the conductive pad 312 to the conductive pillar 152. The UBM layer 150, the conductive pillar 152 and the solder layer 320 form a bonding structure 304.

Figure 19:
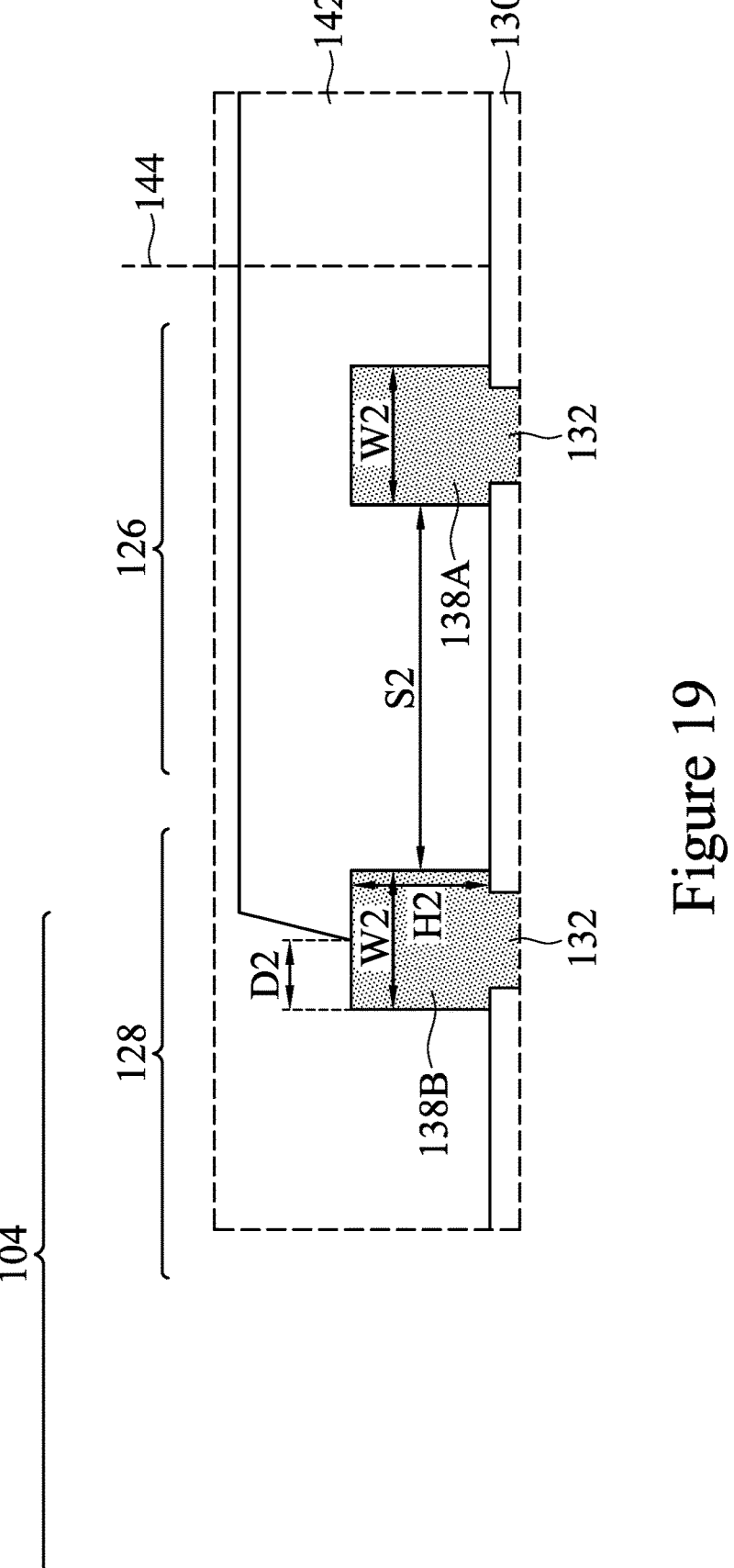
FIG. 19 illustrates a cross-sectional view of an interme-diate stage of manufacturing of a device in accordance with some embodiments.

FIG. 19 illustrates a cross-sectional view of an intermediate stage in the manufacturing of devices in accordance with some embodiments. FIG. 19 is an intermediate stage of processing and view similar to that described and illustrated in FIG. 11B above and the description of forming this intermediate stage of processing is not repeated herein. This embodiment is similar to the previous embodiment except that the passivation layer 140 between the seal ring structures 126 and 128 and the buffer layer 142 is omitted. Details regarding this embodiment that are similar to those for the previously described embodiment will not be repeated herein.

In FIG. 19, the outermost sidewall/edge of the buffer layer 142 is overlying the redistribution layer 138B of the seal ring structure 128 such that the buffer layer 142 fills the opening between the redistribution layer 138A of the seal ring structure 126 and the redistribution layer 138B of the seal ring structure 128. The redistribution layer 138B has a width (W2) that is greater than or equal to about 4 µm. This enables good landing process capability control for the overlying buffer layer 142 based on the accuracy capability of the exposure tool (accuracy ±2 µm). In some embodiments, the redistribution layer 138B has a height H2 as measured from a top surface of the passivation layer 130 to a top surface of the redistribution layer 138B. In some embodiments, the aspect ratio (H2/S2) of the opening between the redistribution layers 138A and 138B is less than about 3. In some embodiments, the aspect ratio (H2/S2) of the opening between the redistribution layers 138A and 138B is less than about 2. In some embodiments, the aspect ratio (H2/S2) of the opening between the redistribution layers 138A and 138B is less than about 1. The aspect ratio (H2/S2) of the opening between the redistribution layers 138A and 138B being less than about 1 enables good step coverage for an overlying seed layer used to for the bumps. Also, in this embodiment, the distance (D2) between the edge of the buffer layer 142 and the outermost edge of the redistribution layer 138B is less than or equal to half the width (W2) of the redistribution layer 138B. In some embodiments, the redistribution layers 138B and 138A each have the height H2 and the width W2.

Figure 20:
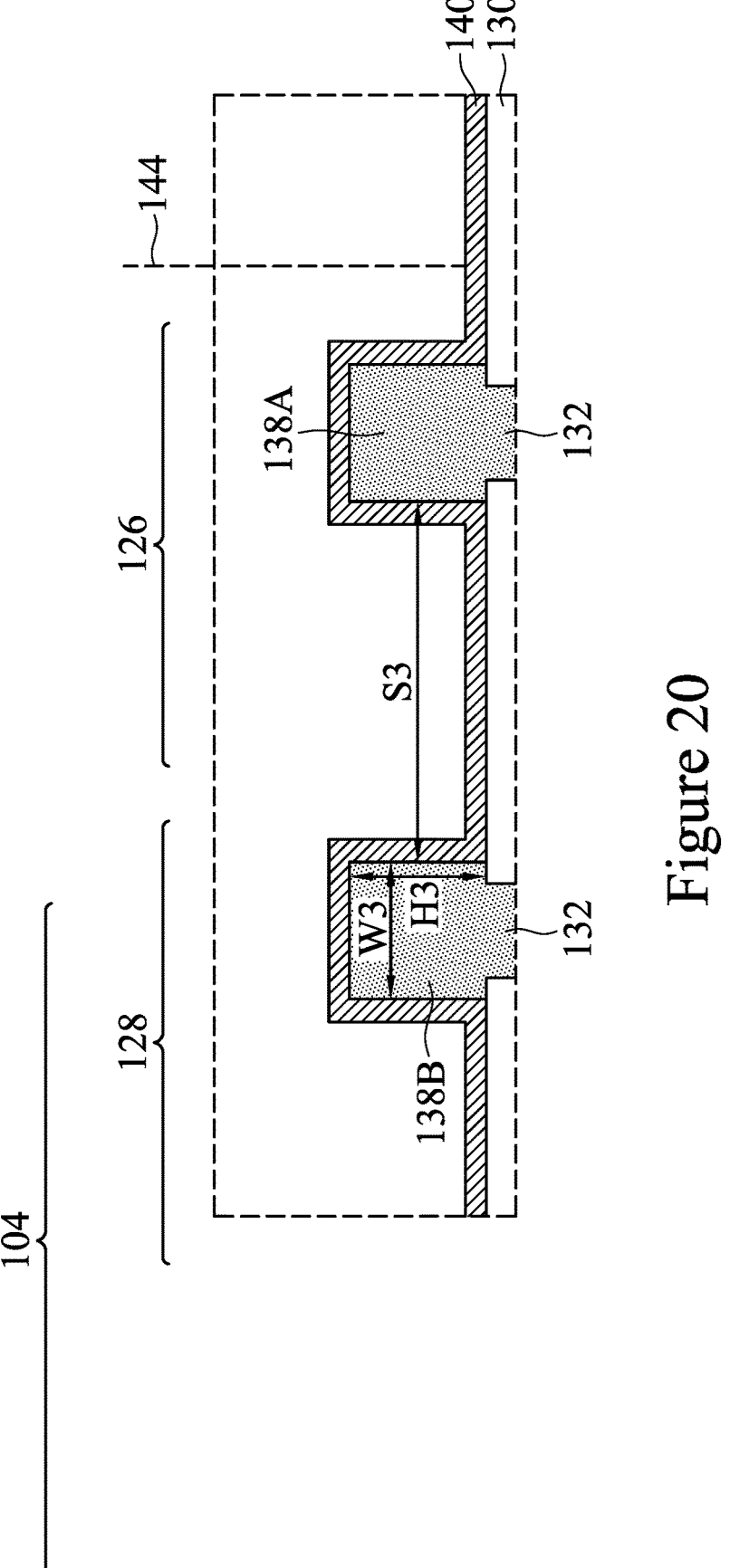
FIG. 20 illustrates a cross-sectional view of an interme-diate stage of manufacturing of a device in accordance with some embodiments.

FIG. 20 illustrates a cross-sectional view of an intermediate stage in the manufacturing of devices in accordance with some embodiments. FIG. 20 is an intermediate stage of processing and view similar to that described and illustrated in FIG. 11B above and the description of forming this intermediate stage of processing is not repeated herein. This embodiment is similar to the previous embodiment except that the buffer layer 142 is omitted. Details regarding this embodiment that are similar to those for the previously described embodiment will not be repeated herein.

In FIG. 20, the redistribution layer 138B a width (W3) that is greater than or equal to about 4 µm. This enables good landing process capability control for the overlying buffer layer 142 based on the accuracy capability of the exposure tool (accuracy ±2 µm). In some embodiments, the redistribution layer 138B has a height H3 as measured from a top surface of the passivation layer 130 to a top surface of the redistribution layer 138B. In some embodiments, the aspect ratio (H3/S3) of the opening between the redistribution layers 138A and 138B is less than about 3. In some embodiments, the aspect ratio (H2/S2) of the opening between the redistribution layers 138A and 138B is less than about 2. In some embodiments, the aspect ratio (H3/S3) of the opening between the redistribution layers 138A and 138B is less than about 1. The aspect ratio (H3/S3) of the opening between the redistribution layers 138A and 138B being less than about 1 enables good step coverage for an overlying seed layer used to for the bumps. Also, in this embodiment, the redistribution layer 138B has a width (W3). In some embodiments, the redistribution layers 138B and 138A each have the height H3 and the width W3.

Figure 21A:
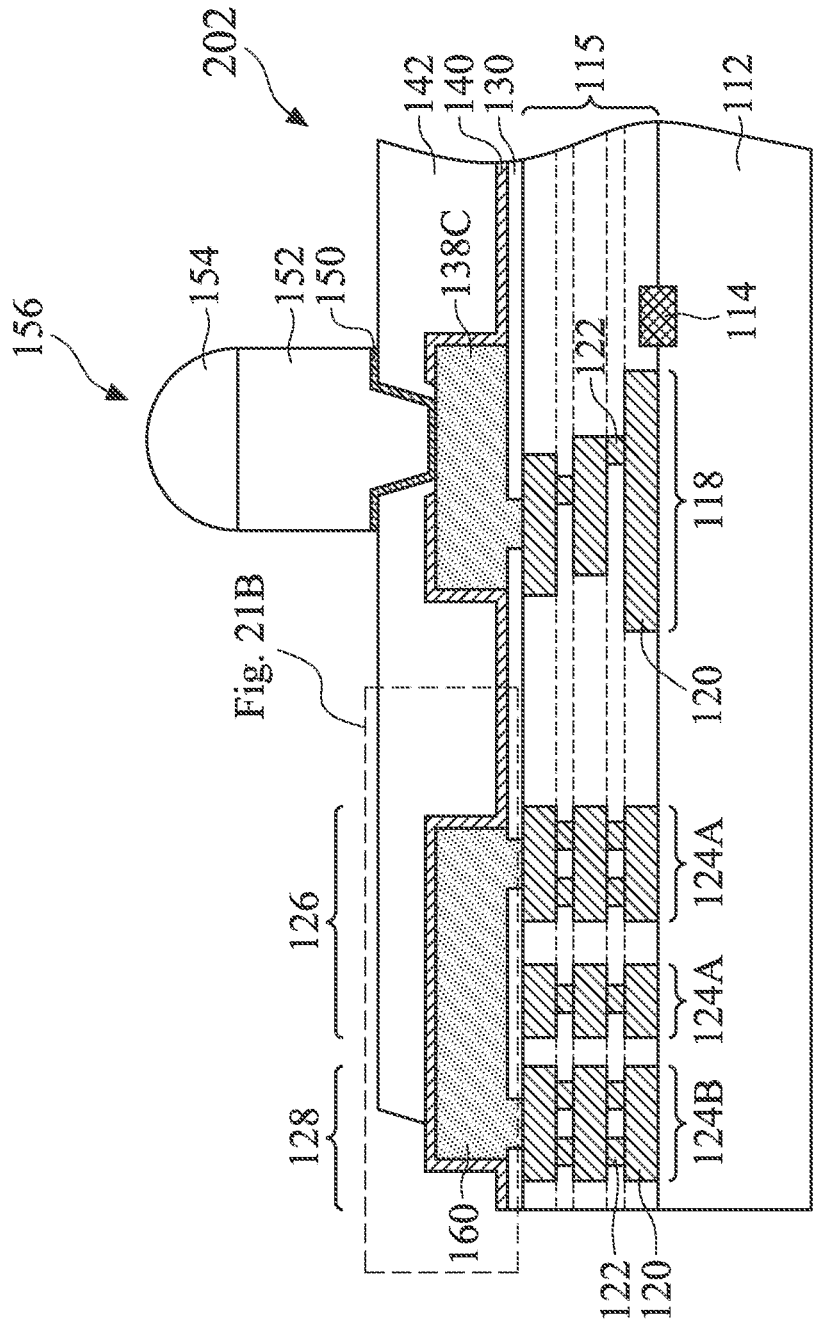
FIGS. 21A and 21B illustrate cross-sectional views of an intermediate stage of manufacturing of a device in accor-dance with some embodiments.
Figure 21B:
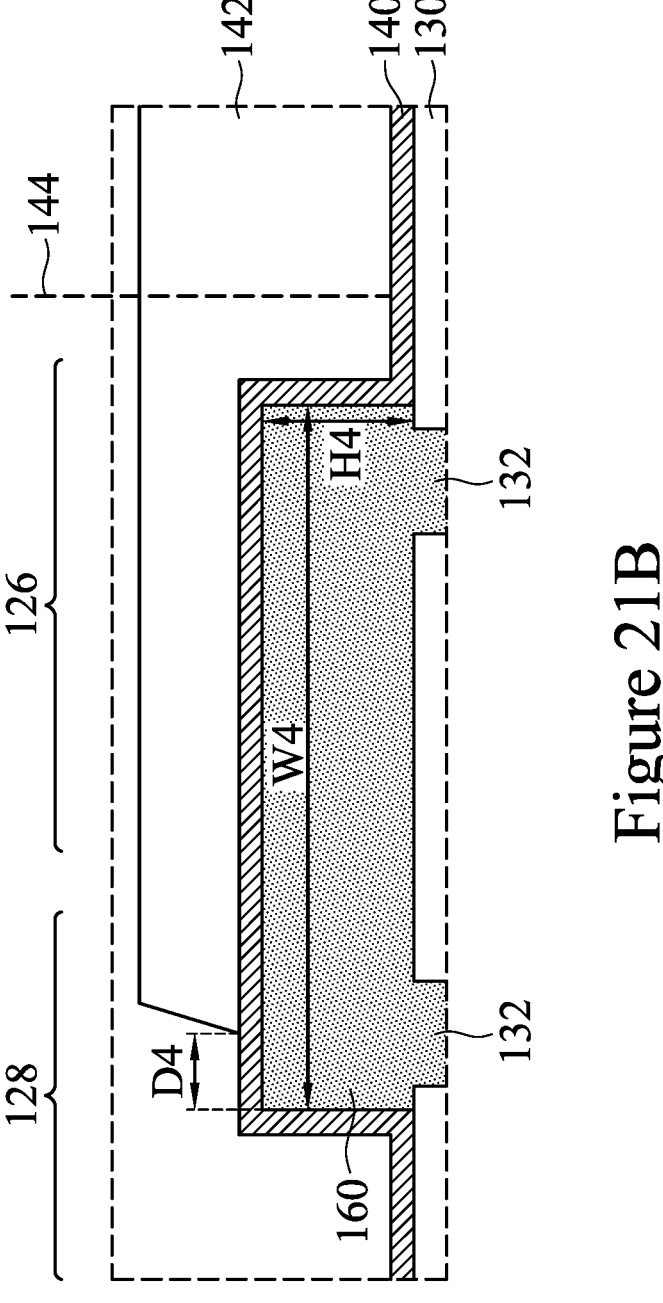

FIGS. 21A and 21B illustrate cross-sectional views of an intermediate stage in the manufacturing of devices in accordance with some embodiments. FIGS. 21A and 21B are an intermediate stage of processing similar to that described and illustrated in FIG. 15 above and the description of forming this intermediate stage of processing is not repeated herein. This embodiment is similar to the embodiment in FIGS. 1 through 15 except that the there is only a single redistribution layer structure for the seal rings 126 and 128. FIG. 21B illustrates a detailed view of a portion of FIG. 21A. Details regarding this embodiment that are similar to those for the previously described embodiment will not be repeated herein.

In FIG. 21A, the redistribution layer 160 may be formed by similar of similar materials and by similar processes as the redistribution layers 138A and 138B described above and the description is not repeated herein. The redistribution layer 160 is physically connected to respective seal ring portions 124A and 124B. The redistribution layers 138C are physically connected to respective interconnect structures 118. Each of the redistribution layers 160 may encircle or surround an interior portion of a respective one of the die regions 106 and an interior portion of a respective one of the unit regions 102.

The seal ring portions 124A and the redistribution layers 160 form seal rings 126 encircling an interior portion of a respective one of the die regions 106. The seal ring portions 124B and the redistribution layers 160 form a seal ring 128 encircling an interior portion of a respective one of the unit regions 102. Each of the seal rings 128 encircles respective ones of the seal rings 126. In some embodiments, the seal rings 126 and 128 may be electrically isolated from the interconnect structures 118. In some embodiments, the seal rings 126 and 128 may have a substantially similar structure. In other embodiments, the seal rings 126 and 128 may have different structures.

In FIG. 21B, the outermost sidewall/edge of the buffer layer 142 is overlying the redistribution layer 160. In some embodiments, the redistribution layer 160 has a height H4 as measured from a top surface of the passivation layer 130 to a top surface of the redistribution layer 160. In some embodiments, the redistribution layer 160 has a width W4. In some embodiments, the width W4 is greater than about 5 μm. In some embodiments, the width W4 is in a range from about 5 μm to about 13 μm. This enables good landing process capability control for the overlying buffer layer 142 and minimizes the aspect ratio (H4/W4) of the redistribution layer 160 to enable good step coverage for an overlying seed layer used to for the bumps. Also, in this embodiment, the distance (D4) between the edge of the overlying buffer layer 142 and the outermost edge of the redistribution layer 160 is less than or equal to half the width (W4). Further, in this embodiment, the redistribution layer 160 is formed over and coupled to a plurality of redistribution layer via openings 132.

FIG. 22 illustrates a cross-sectional view of an intermediate stage in the manufacturing of devices in accordance with some embodiments. FIG. 22 is an intermediate stage of processing and view similar to that described and illustrated in FIG. 21B above and the description of forming this intermediate stage of processing is not repeated herein. This embodiment is similar to the previous embodiment except the redistribution layer 160 is formed over and coupled to a single redistribution layer via opening 132. Details regarding this embodiment that are similar to those for the previously described embodiment will not be repeated herein.

In FIG. 22, the outermost sidewall/edge of the buffer layer 142 is overlying the redistribution layer 160 such that the buffer layer 142. In some embodiments, the redistribution layer 160 has a height H5 as measured from a top surface of the passivation layer 130 to a top surface of the redistribution layer 160. In some embodiments, the redistribution layer 160 has a width W5. In some embodiments, the width W5 is greater than about 5 μm. In some embodiments, the width W5 is in a range from about 5 μm to about 13 μm. This enables good landing process capability control for the overlying buffer layer 142 and minimizes the aspect ratio (H5/W5) of the redistribution layer 160 to enable good step coverage for an overlying seed layer used to for the bumps. Also, in this embodiment, the distance (D5) between the edge of the overlying buffer layer 142 and the outermost edge of the redistribution layer 160 is less than or equal to half the width (W5). Further, in this embodiment, the redistribution layer 160 is formed over and coupled to a plurality of redistribution layer via openings 132.

FIG. 23 illustrates a cross-sectional view of an intermediate stage in the manufacturing of devices in accordance with some embodiments. FIG. 23 is an intermediate stage of processing and view similar to that described and illustrated in FIG. 21B above and the description of forming this intermediate stage of processing is not repeated herein. This embodiment is similar to the previous embodiment except that the passivation layer 140 is omitted. Details regarding this embodiment that are similar to those for the previously described embodiment will not be repeated herein.

In FIG. 23, the outermost sidewall/edge of the buffer layer 142 is overlying the redistribution layer 160 such that the buffer layer 142. In some embodiments, the redistribution layer 160 has a height H6 as measured from a top surface of the passivation layer 130 to a top surface of the redistribution layer 160. In some embodiments, the redistribution layer 160 has a width W6. In some embodiments, the width W6 is greater than about 5 μm. In some embodiments, the width W6 is in a range from about 5 μm to about 13 μm. This enables good landing process capability control for the overlying buffer layer 142 and minimizes the aspect ratio (H6/W6) of the redistribution layer 160 to enable good step coverage for an overlying seed layer used to for the bumps.

Also, in this embodiment, the distance (D6) between the edge of the overlying buffer layer 142 and the outermost edge of the redistribution layer 160 is less than or equal to half the width (W6). Further, in some embodiment, the redistribution layer 160 is formed over and coupled to a plurality of redistribution layer via openings 132. In some embodiments, the redistribution layer 160 is formed over and coupled to a single redistribution layer via opening 132.

FIG. 24 illustrates a cross-sectional view of an intermediate stage in the manufacturing of devices in accordance with some embodiments. FIG. 24 is an intermediate stage of processing and view similar to that described and illustrated in FIG. 21B above and the description of forming this intermediate stage of processing is not repeated herein. This embodiment is similar to the previous embodiment except that the buffer layer 142 is omitted. Details regarding this embodiment that are similar to those for the previously described embodiment will not be repeated herein.

In FIG. 24, the redistribution layer 160 has a height H7 as measured from a top surface of the passivation layer 130 to a top surface of the redistribution layer 160. In some embodiments, the redistribution layer 160 has a width W7. In some embodiments, the width W7 is greater than about 5 μm. In some embodiments, the width W7 is in a range from about 5 μm to about 13 μm. This minimizes the aspect ratio (H6/W6) of the redistribution layer 160 to enable good step coverage for an overlying seed layer used to for the bumps. Further, in some embodiment, the redistribution layer 160 is formed over and coupled to a plurality of redistribution layer via openings 132. In some embodiments, the redistribution layer 160 is formed over and coupled to a single redistribution layer via opening 132.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Embodiments include a seal ring structure that improves the step coverage for an overlying seed layer and improves the landing process capability of an overlying insulating layer. This seal ring structure may be formed in the interconnect structure or redistribution structure of a semiconductor package. The disclosed seal ring structure improves the step coverage and uniformity for the overlying seed layer by reducing the aspect ratio (height/spacing) for an opening between seal ring structures. Further, the redistribution layer (RDL) has a large width to improve the overlying insulating layer landing process control. The seed layer uniformity is important for determining the coplanarity of the bumps that are formed on the seed layer. Further, the seed layer may be deposited by a sputtering process, and a smooth seal ring and overlying insulating layer topography enables the seed layer to have good uniformity.

In an embodiment, a semiconductor package including a first die, the first die including a first semiconductor substrate having an active device in a first surface of the first semiconductor substrate a plurality of dielectric layers over the first surface of the first semiconductor substrate a plurality of metal layers and vias in the plurality of dielectric layers, the plurality of metal layers and vias including a first portion of the plurality of metal layers and vias electrically coupled to the active device and a second portion of the plurality of metal layers and vias along a periphery of the first semiconductor substrate, the second portion of the plurality of metal layers and vias surrounding the first portion of the plurality of metal layers and vias a first passivation layer over the plurality of dielectric layers and the plurality of metal layers and vias a first redistribution layer over the first passivation layer and extending through the first passivation layer to physically contact the first portion of the plurality of metal layers and vias a second redistribution layer over the first passivation layer and extending through the first passivation layer to physically contact the second portion of the plurality of metal layers and vias and a polymer layer over the first redistribution layer and the second redistribution layer, the polymer layer having an outermost edge that is over and laterally within the bounds of a top surface of the second redistribution layer.

Embodiments may include one or more of the following features. The semiconductor package further including a third redistribution layer over the first passivation layer and extending through the first passivation layer to physically contact the second portion of the plurality of metal layers and vias. The semiconductor package where the second redistribution layer has a first height and a first width, and where the second redistribution layer is spaced apart from the third redistribution layer by a first spacing, where the first height divided by the first spacing is less than three. The semiconductor package where the second redistribution layer has a first height and a first width, and where a distance from the outermost edge of the polymer layer and an outermost edge of the second redistribution layer is a first distance, the first distance being greater than or equal to half of the first width. The semiconductor package further including a passivation layer between second redistribution layer and the polymer layer, the passivation layer being a conformal layer. The semiconductor package where first redistribution layer and the second redistribution layer are made of copper. The semiconductor package further including a conductive connector on the polymer layer, the conductive connector extending through the polymer layer to be electrically coupled to the first redistribution layer. The semiconductor package further including a second substrate, the first die being electrically coupled and bonded to the second substrate by the conductive connector.

In an embodiment, a semiconductor package including a first die, the first die including a first semiconductor substrate having an active device in a first surface of the first semiconductor substrate a plurality of dielectric layers over the first surface of the first semiconductor substrate a plurality of metal layers and vias in the plurality of dielectric layers, the plurality of metal layers and vias including a first portion of the plurality of metal layers and vias electrically coupled to the active device second portion of the plurality of metal layers and vias along a periphery of the first semiconductor substrate, the second portion of the plurality of metal layers and vias surrounding the first portion of the plurality of metal layers and vias a first passivation layer over the plurality of dielectric layers and the plurality of metal layers and vias a first redistribution layer over the first passivation layer and extending through the first passivation layer to physically contact the first portion of the plurality of metal layers and vias a second redistribution layer over the first passivation layer and extending through the first passivation layer to physically contact the second portion of the plurality of metal layers and vias polymer layer over the first redistribution layer and the second redistribution layer, the polymer layer having an outermost edge that is over and laterally within the bounds of a top surface of the second redistribution layer.

Embodiments may include one or more of the following features. The semiconductor package further including a third redistribution layer over the first passivation layer and extending through the first passivation layer to physically contact the second portion of the plurality of metal layers and vias. The semiconductor package where the second redistribution layer has a first height and a first width, and where the second redistribution layer is spaced apart from the third redistribution layer by a first spacing, where the first height divided by the first spacing is less than three. The semiconductor package where the second redistribution layer has a first height and a first width, and where a distance from the outermost edge of the polymer layer and an outermost edge of the second redistribution layer is a first distance, the first distance being greater than or equal to half of the first width. The semiconductor package further including a passivation layer between second redistribution layer and the polymer layer, the passivation layer being a conformal layer. The semiconductor package where first redistribution layer and the second redistribution layer are made of copper. The semiconductor package further including a conductive connector on the polymer layer, the conductive connector extending through the polymer layer to be electrically coupled to the first redistribution layer. The semiconductor package further including a second substrate, the first die being electrically coupled and bonded to the second substrate by the conductive connector.

In an embodiment, a method including forming a plurality of active devices in a wafer, the wafer including a plurality of die regions, each of the die regions having at least one active device forming an interconnect structure over the wafer, the interconnect structure including a plurality of metal layers and vias in a plurality of dielectric layers, the plurality of metal layers and vias in each of the plurality of die regions including a first portion of the plurality of metal layers and vias electrically coupled to one of the plurality of active devices and a second portion of the plurality of metal layers and vias along a periphery of the respective die region forming a first passivation layer over the interconnect structure forming redistribution layers over the first passivation layer, each of the plurality of die regions including a first redistribution layer and a second redistribution layer, the first redistribution layer extending through the first passivation layer to physically contact the respective first portion of the plurality of metal layers and vias, the second redistribution layer extending through the first passivation layer to physically contact the respective second portion of the plurality of metal layers and vias and forming a polymer layer over the redistribution layers, the polymer layer having an outermost edge that is over and laterally within the bounds of top surfaces of the second redistribution layers.

Embodiments may include one or more of the following features. The method further including singulating the wafer to form a plurality of die regions, the singulating including sawing along areas of the wafer disposed between adjacent second redistribution layers. The method where each of the plurality of die regions further includes a third redistribution layer, the third redistribution layer extending through the first passivation layer to physically contact the respective second portion of the plurality of metal layers and vias, where a first one of the second redistribution layers has a first height and a first width, and where the first one of the second redistribution layers is spaced apart from a first one of the third redistribution layers by a first spacing, where the
first height divided by the first spacing is less than three.

The foregoing outlines features of several embodiments
so that those skilled in the art may better understand the
aspects of the present disclosure. Those skilled in the art
should appreciate that they may readily use the present
disclosure as a basis for designing or modifying other
processes and structures for carrying out the same purposes
and/or achieving the same advantages of the embodiments
introduced herein. Those skilled in the art should also realize
that such equivalent constructions do not depart from the
spirit and scope of the present disclosure, and that they may
make various changes, substitutions, and alterations herein
without departing from the spirit and scope of the present
disclosure.

What is claimed is:

1. A method comprising:
forming an active device on a first substrate;
forming an interconnect structure over the first substrate,
the interconnect structure comprising multiple conduc-
tive layers with vias connecting the multiple conductive
layers, the conductive layers of the interconnect struc-
ture being electrically coupled to the active device;
forming a seal ring structure over the first substrate and
along a periphery of the first substrate, the seal ring
structure comprising multiple conductive layers with
vias connecting the multiple conductive layers, the seal
ring structure having a topmost conductive layer, the
topmost conductive layer being the conductive layer of
the seal ring structure that is furthest from the first
substrate, the topmost conductive layer of the seal ring
structure having an inner conductive structure and an
outer conductive structure, the inner conductive struc-
ture being spaced apart from the outer conductive
structure, the inner conductive structure and the outer
conductive structure being electrically isolated from
the interconnect structure, the outer conductive struc-
ture having a first sidewall and a second sidewall, the
first sidewall facing the inner conductive structure, the
second sidewall facing away from the inner conductive
structure; and
forming a polymer layer over the seal ring structure, an
outermost edge of the polymer layer being laterally
between the first and second sidewalls of the outer
conductive structure of the seal ring structure, the
polymer layer having a planar top surface over the
inner conductive structure and the outer conductive
structure.

2. The method of claim 1 further comprising:
forming a passivation layer on a top surface and sidewalls
of the topmost conductive layer of the seal ring struc-
ture, the passivation layer being a conformal layer, the
polymer layer being formed over the passivation layer.

3. The method of claim 1, wherein the interconnect
structure and the seal ring structure are formed at a same
time.

4. The method of claim 1, wherein forming the intercon-
nect structure further comprises:
forming a topmost conductive layer, the topmost conduc-
tive layer of the interconnect structure being the con-
ductive layer of the interconnect structure that is fur-
thest from the first substrate, the topmost conductive
layer of the interconnect structure being formed at a
same time as the topmost conductive layer of the seal
ring structure.

5. The method of claim 4 further comprising:
forming a conductive connector on the polymer layer, the
conductive connector extending through the polymer
layer to be electrically coupled to the topmost conduc-
tive layer of the interconnect structure, the inner con-
ductive structure and the outer conductive structure
being free from overlying conductive connectors.

6. The method of claim 5 further comprising:
bonding a second substrate to the conductive connector.

7. The method of claim 4, wherein the topmost conductive
layers of the interconnect structure and the seal ring struc-
ture are made of copper.

8. The method of claim 1, wherein the outer conductive
structure of the seal ring structure has a first height and a first
width, and wherein the outer conductive structure is spaced
apart from the inner conductive structure by a first spacing,
wherein the first height divided by the first spacing is less
than three.

9. The method of claim 1, wherein the outer conductive
structure of the seal ring structure has a first height and a first
width, and wherein a distance from the outermost edge of
the polymer layer and an outermost edge of the outer
conductive structure of the seal ring structure is a first
distance, the first distance being greater than or equal to half
of the first width.

10. A method comprising:
forming an interconnect structure over a substrate, the
substrate comprising an active device, the interconnect
structure comprising a plurality of metal layers and vias
in a plurality of dielectric layers, the plurality of metal
layers and vias comprising:
a first portion of the plurality of metal layers and vias
electrically coupled to the active device; and
a second portion of the plurality of metal layers and
vias along a periphery of the substrate;
forming a first redistribution layer, a second redistribution
layer, and a third redistribution layer over the intercon-
nect structure, the first redistribution layer physically
contacting the first portion of the plurality of metal
layers and vias, the second redistribution layer physi-
cally contacting the second portion of the plurality of
metal layers and vias, the third redistribution layer
physically contacting the second portion of the plurality
of metal layers and vias, the second redistribution layer
being spaced apart from the third redistribution layer by
a first spacing, the second portion of the plurality of
metal layers and vias and the second and third redis-
tribution layers being part of a seal ring structure, the
second and third redistribution layers being in a top
conductive layer of the seal ring structure that is
furthest from the substrate; and
forming a polymer layer over the first, second, and third
redistribution layers, the polymer layer covering the
first and the third redistribution layers and partially
covering the second redistribution layer, the polymer
layer having an outermost edge that is over and later-
ally within bounds of a top surface of the second
redistribution layer, the polymer layer having a non-
uniform thickness over the first, second, and third
redistribution layers and the interconnect structure, the
polymer layer having a planar top surface over the first,
second, and third redistribution layers and the inter-
connect structure.

11. The method of claim 10, wherein the second redistri-
bution layer has a first height and a first width, and wherein
the second redistribution layer is spaced apart from the third redistribution layer by a first spacing, wherein the first height divided by the first spacing is less than three.

12. The method of claim 10, wherein the second redistribution layer has a first height and a first width, and wherein a distance from the outermost edge of the polymer layer and an outermost edge of the second redistribution layer is a first distance, the first distance being greater than or equal to half of the first width.

13. The method of claim 10, further comprising:

forming a passivation layer over the first redistribution layer, the second redistribution layer, and the third redistribution layer, the polymer layer being formed over the passivation layer.

14. The method of claim 13, wherein the passivation layer is a conformal layer.

15. The method of claim 10, wherein the first redistribution layer and the second redistribution layer are made of copper.

16. The method of claim 10, further comprising:

forming a conductive connector on the polymer layer, the conductive connector extending through the polymer layer and being electrically coupled to the first redistribution layer, the second and third redistribution layers being free from overlying conductive connectors.

17. The method of claim 16, further comprising:

bonding a second substrate to the conductive connector.

18. A method comprising:

forming an interconnect structure over a substrate, the substrate comprising an active device, wherein forming the interconnect structure comprises forming a plurality of metal layers and vias in a plurality of dielectric layers, the plurality of metal layers and vias comprising a first portion of the plurality of metal layers and vias electrically coupled to the active device, and a second portion of the plurality of metal layers and vias along a periphery of the substrate;

conformally depositing a first passivation layer over the interconnect structure;

forming a first redistribution layer, a second redistribution layer, and a third redistribution layer over the interconnect structure and the first passivation layer, each of the first redistribution layer, the second redistribution layer, and the third redistribution layer extending through the first passivation layer, the first redistribution layer physically contacting the first portion of the plurality of metal layers and vias, the second redistribution layer physically contacting the second portion of the plurality of metal layers and vias, the third redistribution layer physically contacting the second portion of the plurality of metal layers and vias, the second redistribution layer being spaced apart from the third redistribution layer by a first spacing, the second redistribution layer having a first sidewall and a second sidewall, the first sidewall facing the first redistribution layer, the second sidewall facing away from the first redistribution layer; and conformally depositing a second passivation layer over the first redistribution layer, the second redistribution layer, and the third redistribution layer;

forming a polymer layer over the second passivation layer, the polymer layer having an outer edge that is over a top surface of the second redistribution layer and between the first and second sidewalls of the second redistribution layer, the polymer layer having a planar top surface extending from over the second redistribution layer to over the third redistribution layer;

forming a conductive connector on the polymer layer, the conductive connector extending through the polymer layer and the second passivation layer and being electrically coupled to the first redistribution layer, the second and third redistribution layers being free from overlying conductive connectors; and bonding a second substrate to the conductive connector, wherein after bonding the second substrate to the conductive connector, the polymer layer covers the third redistribution layer.

19. The method of claim 18, wherein the second redistribution layer has a first height and a first width, and wherein the second redistribution layer is spaced apart from the third redistribution layer by a first spacing, wherein the first height divided by the first spacing is less than three.

20. The method of claim 18, wherein the second redistribution layer has a first height and a first width, and wherein a distance from the outer edge of the polymer layer and an outer edge of the second redistribution layer is a first distance, the first distance being greater than or equal to half of the first width.

* * * * *